US006853364B2

(12) United States Patent
Kai et al.

(10) Patent No.: US 6,853,364 B2
(45) Date of Patent: Feb. 8, 2005

(54) LIQUID CRYSTAL DISPLAY DEVICE

(75) Inventors: Tsutomu Kai, Kawasaki (JP); Susumu Okazaki, Kawasaki (JP); Hongyong Zhang, Kawasaki (JP); Noriyuki Ohashi, Kawasaki (JP)

(73) Assignee: Fujitsu Display Technologies Corporation, Kawasaki (JP)

( * ) Notice: Subject to any disclaimer, the term of this patent is extended or adjusted under 35 U.S.C. 154(b) by 396 days.

(21) Appl. No.: 10/025,044

(22) Filed: Dec. 18, 2001

(65) Prior Publication Data

US 2002/0140650 A1 Oct. 3, 2002

(30) Foreign Application Priority Data

Mar. 30, 2001 (JP) ...................................... 2001-101176

(51) Int. Cl.[7] .......................... G09G 3/36; G01R 31/26; H01L 21/00; H01L 21/78; H01L 21/301

(52) U.S. Cl. ........................... 345/100; 345/98; 438/14; 438/18; 438/30; 438/460

(58) Field of Search ...................... 345/87, 92, 98–100, 345/103, 904; 349/54, 151, 152, 192, 149; 324/156; 438/17, 18, 30, 460, 462, 464

(56) References Cited

U.S. PATENT DOCUMENTS 6,023,260 A * 2/2000 Higashi ...................... 345/100
6,064,222 A * 5/2000 Morita et al. ............... 324/770
6,100,865 A * 8/2000 Sasaki ........................ 345/100
6,157,358 A * 12/2000 Nakajima et al. ............. 345/96
6,166,713 A * 12/2000 Asai et al. .................... 345/92
6,337,677 B1 * 1/2002 Higashi ...................... 345/100
6,424,328 B1 * 7/2002 Ino et al. ....................... 345/87
6,525,556 B2 * 2/2003 Matsueda ................... 324/770
6,639,634 B1 * 10/2003 Zhang et al. ................. 349/54
2002/0047838 A1 * 4/2002 Aoki et al. ................. 345/205
2003/0184334 A1 * 10/2003 Matsunaga et al. ......... 324/765

FOREIGN PATENT DOCUMENTS

| | | |
|---|---|---|
| JP | 9-152629 | 6/1997 |
| WO | WO 96/24123 | 8/1996 |

* cited by examiner

*Primary Examiner*—Bipin Shalwala
*Assistant Examiner*—David L. Lewis
(74) *Attorney, Agent, or Firm*—Greer, Burns & Crain, Ltd.

(57) ABSTRACT

A liquid crystal display device includes a display circuit having data lines and scanning lines arranged in two-dimensional matrix, and switching elements connected between the data lines and the scanning lines. A first inspection circuit is also provided, including an inspection voltage input and/or output terminal for inputting and/or outputting an inspection voltage to/from one ends of the data lines via a first analog switch. A second inspection circuit includes an inspection voltage input and/or output terminal for inputting and/or outputting an inspection voltage to/from the other ends of the data lines. The display circuit, the first inspection circuit, and the second inspection circuit are provided on one substrate, and the first inspection circuit is constructed to be separated from the rest of the display circuit.

40 Claims, 26 Drawing Sheets

LIQUID CRYSTAL DISPLAY DEVICE

CROSS-REFERENCE TO RELATED APPLICATIONS

This application is based upon and claims priority of Japanese Patent Application No. 2001-101176, filed on Mar. 30, 2001, the contents being incorporated herein by reference.

BACKGROUND OF THE INVENTION

1. Field of the Invention

The present invention relates to a liquid crystal display device and, more specifically, to a liquid crystal display device with switching elements connected to data lines and scanning lines.

2. Description of the Related Art

FIG. 26 shows a structure of a liquid crystal display substrate according to the prior art. A data driver (data line driver) 5 is connected to a pixel region 7 via data lines 3. A gate driver (scanning line driver) 6 is connected to the pixel region 7 via scanning lines 4. The data driver 5 can supply data to the data lines 3. The gate driver 6 can supply scanning signals to the scanning lines 4.

The pixel region 7 has switching elements (TFTs: Thin Film Transistors) 1 and liquid crystal capacitors 2 which are arranged in a two-dimensional matrix. The TFTs 1 are n-channel MOS transistors, of which gates are connected to the scanning lines 4, drains are connected to the data lines 3, and sources are connected to an electrode 8 on an opposite substrate via the liquid crystal capacitors 2.

A main method of inspecting this liquid crystal display substrate is a method of touching probe pins to ends of each vertical and horizontal lines of the matrix, which needs a large number of probe pins, leading to an expensive inspecting apparatus. This inspection method has a great number of steps because a large number of check terminals are individually inspected. Therefore, the liquid crystal display substrate is subjected to perform display in its finished state as a panel, for a complete inspection, which is a factor causing reduced yields.

FIG. 27 shows another liquid crystal display substrate according to the prior art. On a substrate 900, provided are a shift register 911, analog switches 912, a display part 916, and a gate driver 915. The gate driver 915 is connected to the pixel region 916 via scanning lines G1 to G4 and so on to supply scanning signals to the scanning lines G1 to G4 and so on in response to gate clocks GCLK and gate start pulses GSP.

The pixel region 916 has TFTs 931 and liquid crystal capacitors 932 which are arranged in a two-dimensional matrix. The TFTs 931 are n-channel MOS transistors, of which gates are connected to scanning lines G1 to G4 and so on, drains are connected to data lines D1, D2 and so on, and sources are connected to an electrode on an opposite substrate via the liquid crystal capacitors 932.

In the analog switches 912, one end of each of input/output terminals is connected to one of data buses V1 to Vn and the other ends are connected to the data lines D1, D2 and so on. The data buses V1 to Vn are connected with a data driver after completion of an inspection and supplied with data.

The shift register 911, capable of m-stage shift, outputs shifted pulses sequentially to control lines Q1 to Qm in response to data clocks DCLK and data start pulses DSP.

The control lines Q1 to Qm are connected to control terminals of the analog switches 912 respectively. When the control lines Q1 to Qm are set to be a high level, the analog switches 912 connect the data buses V1 to Vn, and, the data lines D1, D2 and so on respectively.

For the inspection of the liquid crystal display substrate, it is necessary to touch probe pins to terminals of the data buses V1 to Vn. In addition, when the number of the data buses V1 to Vn is increased, high temperature polysilicon needs to be used to operate the liquid crystal display substrate at a high speed, resulting in an expensive liquid crystal display substrate.

SUMMARY OF THE INVENTION

It is an object of the present invention to provide a liquid crystal display device capable of being easily inspected in a short time without using a large number of probe pins in an inspecting apparatus.

It is another object of the present invention to inspect an inexpensive liquid crystal display device with ease and in a short time.

According to an aspect of the present invention, a liquid crystal display device is provided, which comprises: a display circuit including data lines and scanning lines arranged in a two-dimensional matrix, and switching elements connected between the data lines and the scanning lines; a first inspection circuit including an inspection voltage input and/or output terminal for inputting and/or outputting an inspection voltage to/from one end of the data line via a first analog switch; and a second inspection circuit including an inspection voltage input and/or output terminal for inputting and/or outputting an inspection voltage to/from the other end of the data line. The display circuit, the first inspection circuit, and the second inspection circuit are provided on one substrate, and the first inspection circuit is separable from the display circuit.

The provision of the first and second inspection circuits on the liquid crystal display substrate enables, before unitization of the liquid crystal display device, inspection of breaks in the data lines, short circuits between adjacent data lines, breaks in the scanning lines, short circuits between adjacent pixels, short circuits to other signal lines, and the like. The separation of the first inspection circuit after the inspection enables the data driver to be connected to the liquid crystal display substrate, thereby providing a liquid crystal display device at a lower cost.

DETAILED DESCRIPTION OF THE PREFERRED EMBODIMENTS

First Embodiment

Figure 1:
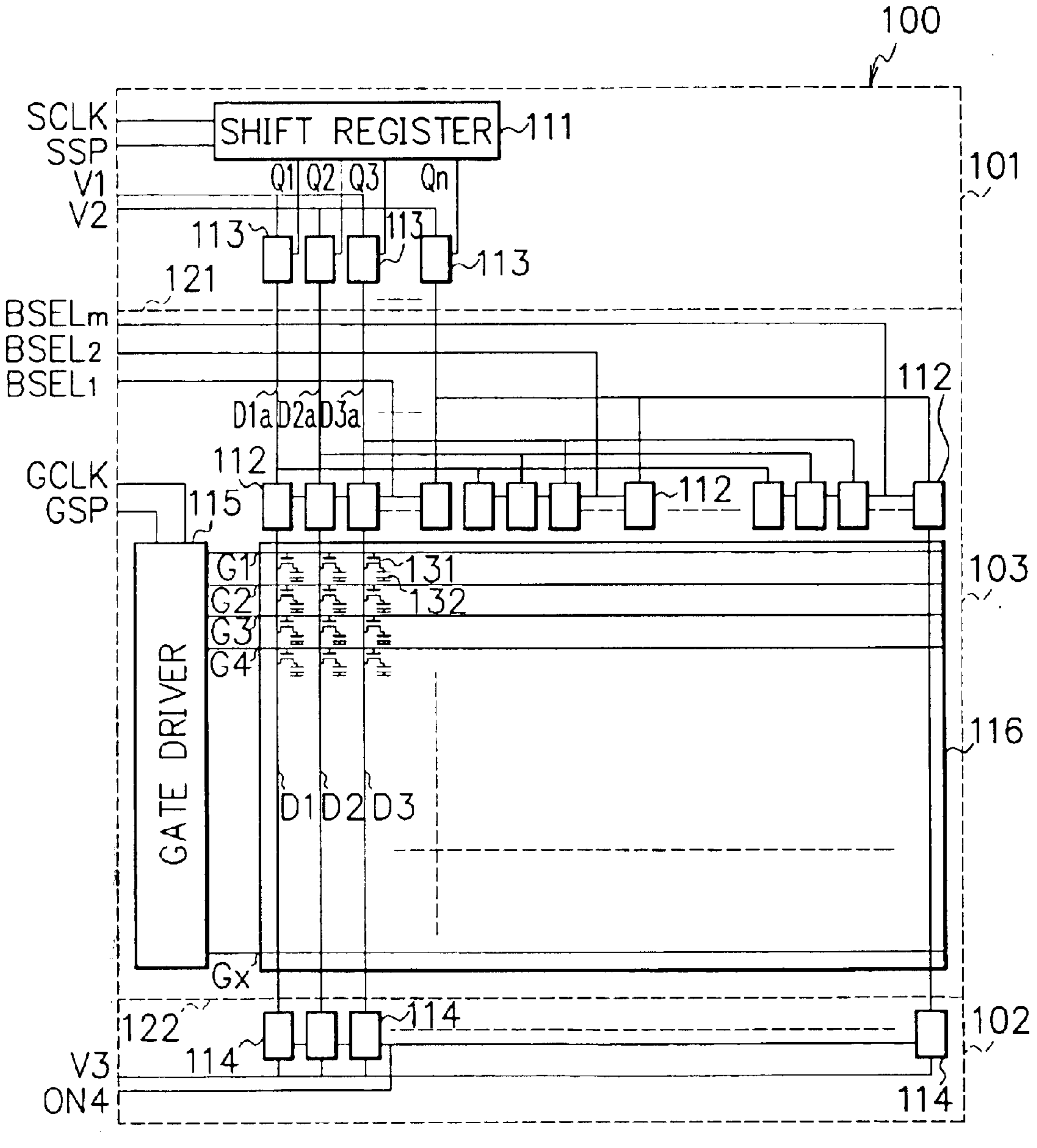
FIG. 1 is a diagram showing a liquid crystal display substrate according to a first embodiment of the present invention.

FIG. 1 shows a liquid crystal display substrate 100 according to the first embodiment of the present invention. A first inspection circuit 101, a display circuit 103, and a second inspection circuit 102 are provided on one glass substrate 100. The first inspection circuit 101 is separable from the display circuit 103 at a cutting line 121. The second inspection circuit 102 is separable from the display circuit 103 at a cutting line 122.

The display circuit 103 has a gate driver 115, a pixel region 116 and analog switches 112. The gate driver 115 is connected to the pixel region 116 through scanning lines G1 to Gx to supply scanning signals to the scanning lines G1 to Gx in response to gate clocks GCLK and gate start pulses GSP.

The pixel region 116 has TFTs 131 and liquid crystal capacitors 132 which are arranged in a two-dimensional matrix. The TFTs 131 are n-channel MOS transistors, of which gates are connected to the scanning lines G1 to Gx, drains are connected to data lines D1 to D3 and so on, and sources (pixel electrodes) are connected to an electrode on an opposite substrate via the liquid crystal capacitors 132.

In the analog switches 112, one end of each of input/output terminals is connected to one of data lines D1*a* to D3*a* and so on, and the other ends are connected to the data lines D1 to D3 and so on. Block selection signal lines BSEL1 to BSELm are connected to control terminals of the analog switches 112 respectively. The analog switches 112 connect the data lines D1*a* to D3*a* and so on, and, the data lines D1 to D3 and so on respectively when the block selection signal lines BSEL1 to BSELm are set to a high level.

Figure 2:
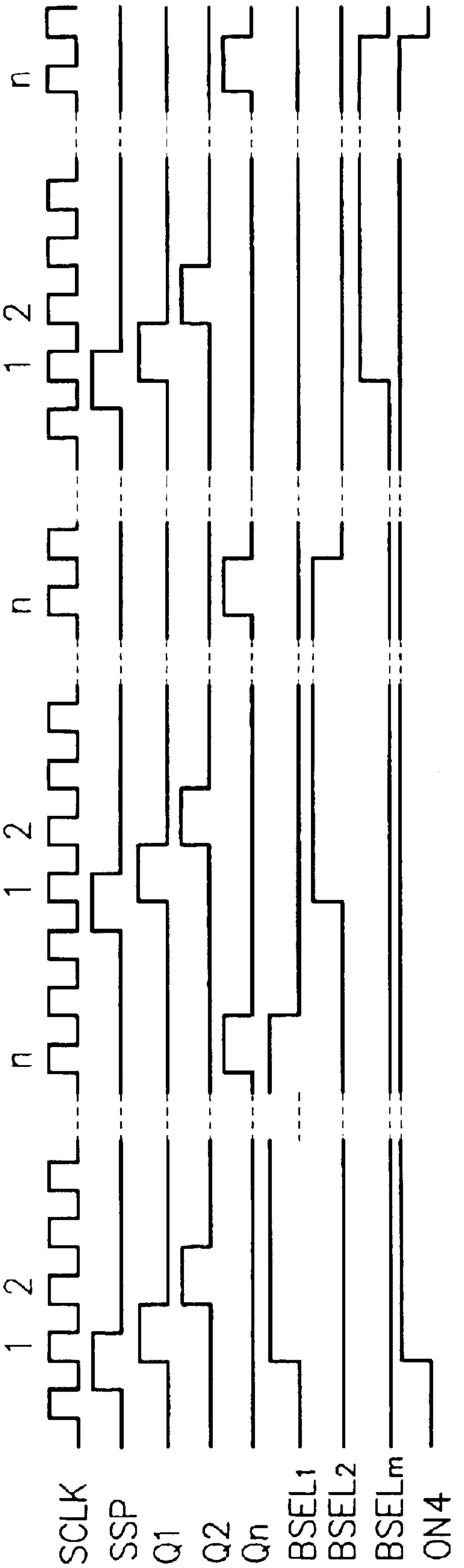
FIG. 2 is a timing chart showing a first inspection method according to the first embodiment.

The first inspection circuit 101 has a shift register 111 and analog switches 113. In the analog switches 113, one end of each of input/output terminals is connected alternately to signal lines V1 and V2, and the other ends are connected to the data lines D1*a* to D3*a* and so on. The shift register 111, capable of n-stage shift, outputs shifted pulses sequentially to control lines Q1 to Qn in response to data clocks SCLK and data start pulses SSP as shown in FIG. 2. The control lines Q1 to Qn are connected to control terminals of the analog switches 113 respectively. The analog switches 113 connect the signal lines V1 and V2, and, the data lines D1*a* to D3*a* and so on respectively when the control lines Q1 to Qn are set to a high level.

The second inspection circuit 102 has analog switches 114. In the analog switches 114, one end of each of input/output terminals is connected to one of the data lines D1 to D3 and so on, and the other ends are connected to a signal line V3. A control line ON4 is connected to control terminals of the analog switches 114. The analog switches 114 connect the data lines D1 to D3 and so on, and, the signal line V3 respectively when the control line ON4 is set to a high level.

As shown in FIG. 2, while the control line ON4 is at the high level, pulses are outputted sequentially to the block selection signal lines BSEL1 to BSELm. While each of the block selection signal lines BSEL1 to BSELm is at the high level, pulses are outputted sequentially to the control lines Q1 to Qn.

First, an inspection signal is inputted to the signal line V3. When the control line ON4 is set to the high level, the analog switches 114 turn on to connect the data lines D1 to D3 and the signal line V3. When the block selection signal line BSEL1 is set to the high level, n analog switches 112 in a first block from the left side turn on to connect the data lines D1*a* to D3*a* and so on, and, the data lines D1 to D3 and so on. When the control line Q1 is set to the high level, the analog switch 113 at the left end turns on to connect the signal line V1 and the data line D1*a*. Similarly the control lines Q2 to Qn are sequentially set to the high level.

By detecting outputs of the signal lines V1 and V2, inspection can be performed. When the control line Q1 is set to the high level, if the inspection signal inputted to the signal line V3 can be detected in the signal line V1, the data lines D1 and D1*a* can be verified as not broken, and if the signal line V1 is open, the data line D1 or D1*a* can be verified as broken. Similarly, when the control line Q2 is set to the high level, if the inspection signal inputted to the signal line V3 can be detected in the signal line V2, the data lines D2 and D2*a* can be verified as not broken, and if the signal line V2 is open, the data line D2 or D2*a* can be verified as broken. In the same manner, whether or not other data lines D3 and D3*a* and so on are broken can be verified. According to this embodiment, the above break in the line can be detected as a defect point.

Figure 3:
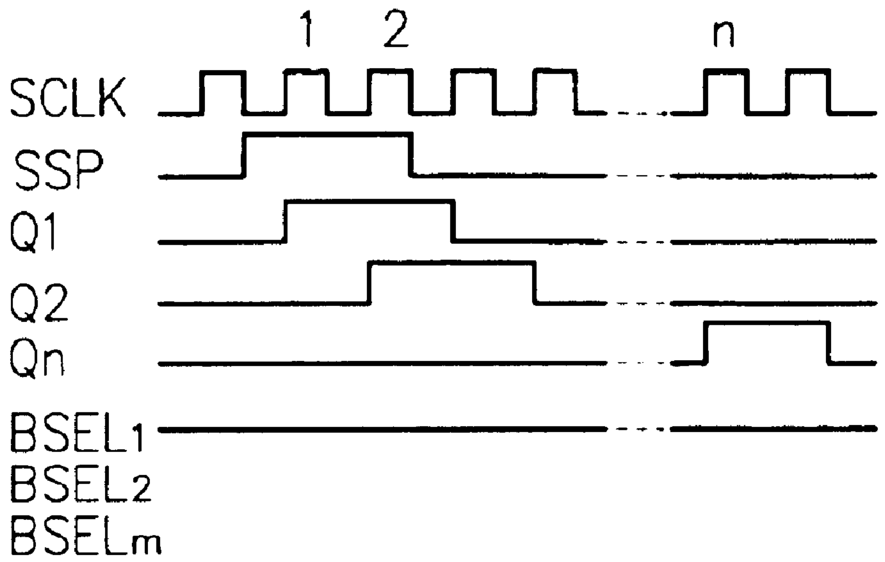
FIG. 3 is a timing chart showing a second inspection method according to the first embodiment.

Next, another inspection method is explained. As shown in FIG. 3, the block selection signal lines BSEL1 to BSELm are set to a low level to turn off the analog switches 112. Then, the cycle of the start pulse SSP is increased to be twice that of the clock SCLK. As a result, there is a period during which both the control lines Q1 and Q2 are at the high level. During the period, an inspection signal is inputted to the signal line V1 to detect an output of the signal line V2. If the inspection signal inputted to the signal line V1 is detected in the signal line V2, the data lines D1*a* and D2*a* can be verified as short-circuiting to each other, and if the signal line V2 is open, the data lines D1*a* and D2*a* can be verified as not short-circuiting to each other. Further, during a period during which both the control lines Q2 and Q3 are at the high level, the existence of a short-circuit between the data lines D2*a* and D3*a* can be verified. Similarly, short circuits between other adjacent data lines can be checked. According to this embodiment, the above short circuit can be detected as a defect point.

Although the case of one shift register 111 is explained in this embodiment, two or more shift registers 111 may be provided. Further, two signal lines V1 and V2 are provided in the first inspection circuit 101, but only one signal line may be provided for inspection of only a break in a line. Further, by increasing the number of the two signal lines V1 and V2, the shift stages of the shift register 111 can be decreased, and even short circuits between non-adjacent data lines D1*a* to D3*a* and so on between the analog switches 112 and 113 can be checked. Furthermore, if a signal on a power supply, ground, or other signal lines is detected in the signal line V2, it can be verified that a short circuit occurs with respect to the power supply or the like.

Figure 4:
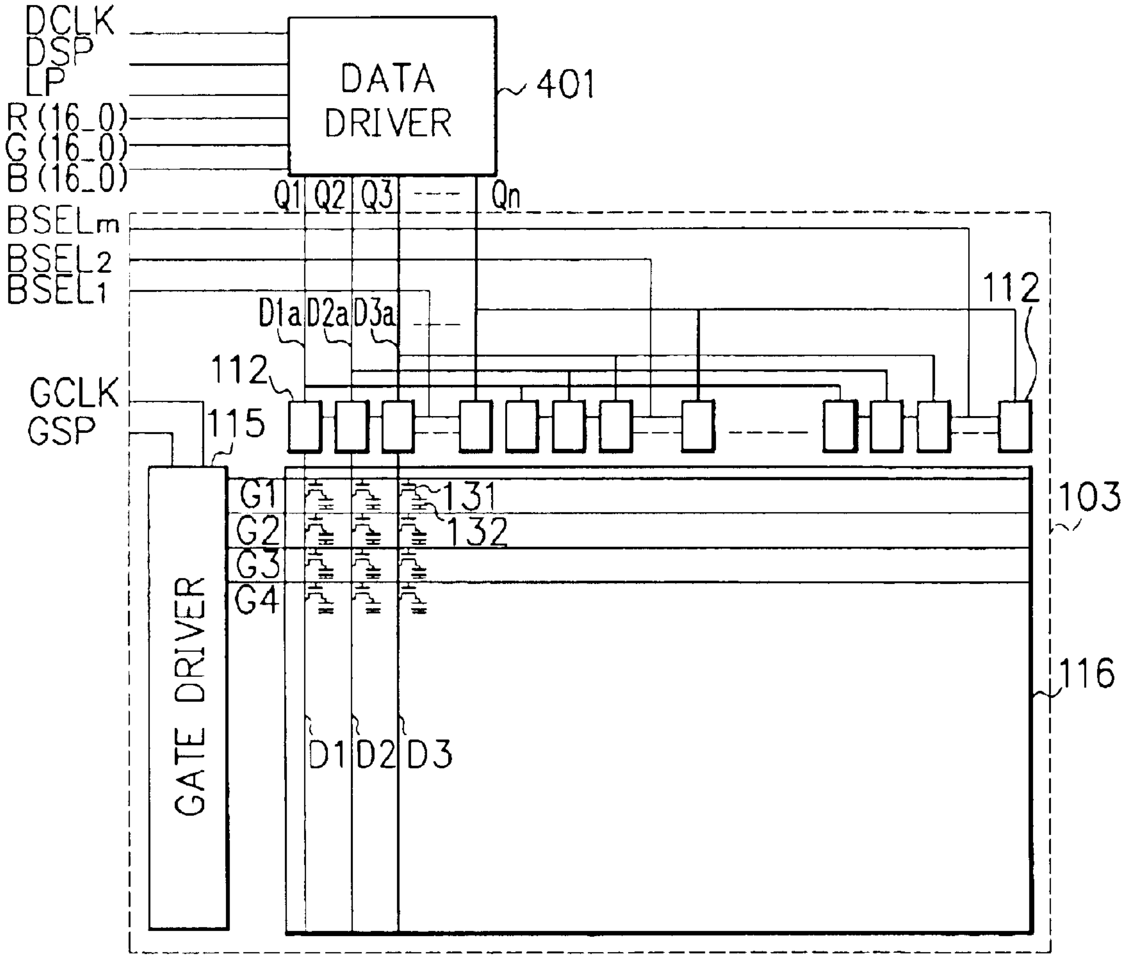
FIG. 4 is a diagram in which a data driver is connected to the liquid crystal display substrate according to the first embodiment.

After the inspection, the first inspection circuit 101 and the second inspection circuit 102 are separated from the display circuit 102 at the cutting lines 121 and 122. Then, as shown in FIG. 4, output lines Q1 to Qn of a data driver 401 are connected to the data lines D1*a* to D3*a* and so on of the display circuit 103 in unitizing the liquid crystal display device. The data driver 401 receives clocks DCLK, start pulses DSP, latch pulses LP and data R, G, B and outputs data to the output lines Q1 to Qn. This enables the liquid crystal display device to perform normal operation.

The second inspection circuit 102 is not necessarily separated from the display circuit 103. When the second inspection circuit 102 is not separated, the analog switches 114 are preferably always turned off during normal operation. Further, the second inspection circuit 102 can be used as a precharge function during normal operation. More specifically, the data line D1 and so on can be precharged by inputting a voltage to the signal line V3 of the second inspection circuit 102 before the data is outputted to the output lines Q1 to Qn of the data driver 401.

Figure 27:
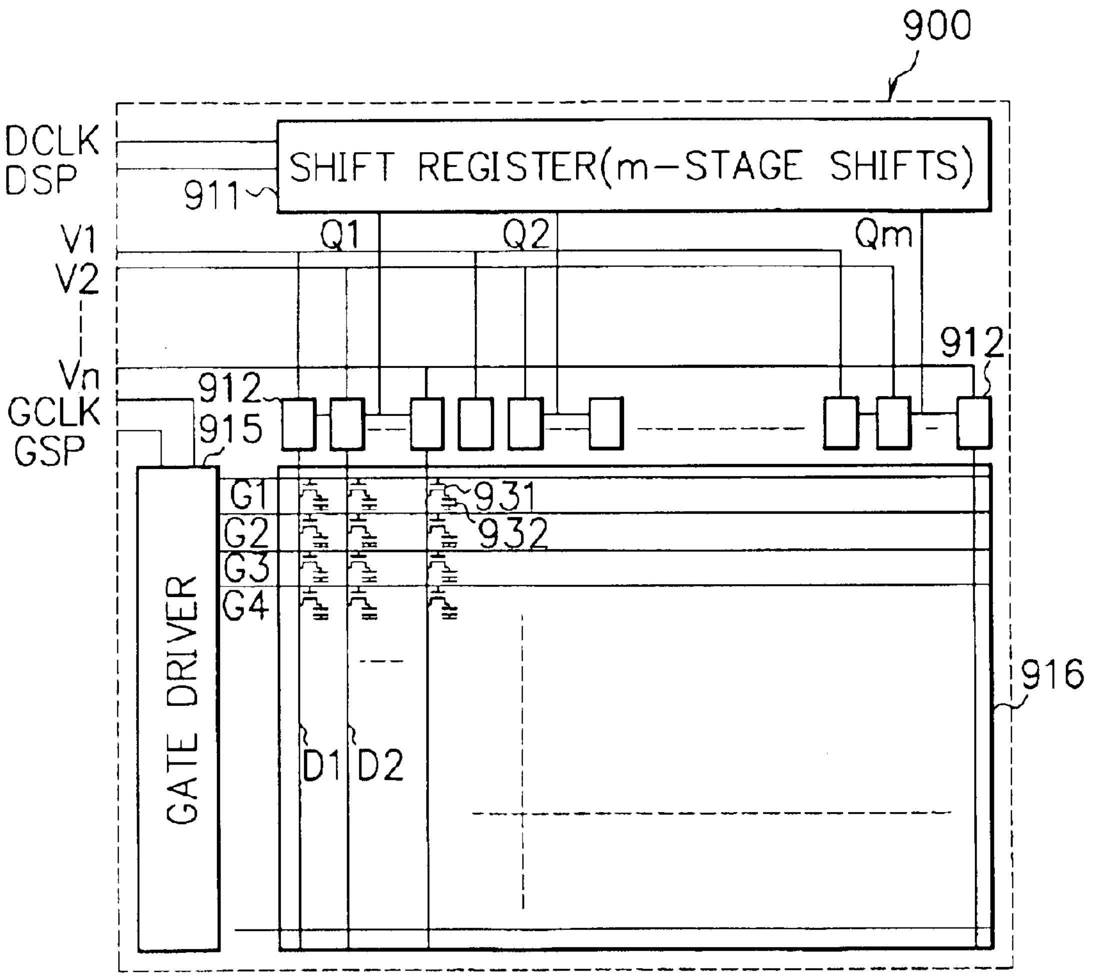
F I G. 27 PRIOR ART
FIG. 27 is a diagram showing another liquid crystal display substrate according to the prior art.

In this embodiment, since the liquid crystal display substrate is capable of display even if it is operated at not such high speed as that by the prior art in FIG. 27, an inexpensive liquid crystal display substrate can be fabricated using low temperature polysilicon.

Second Embodiment

Figure 5:
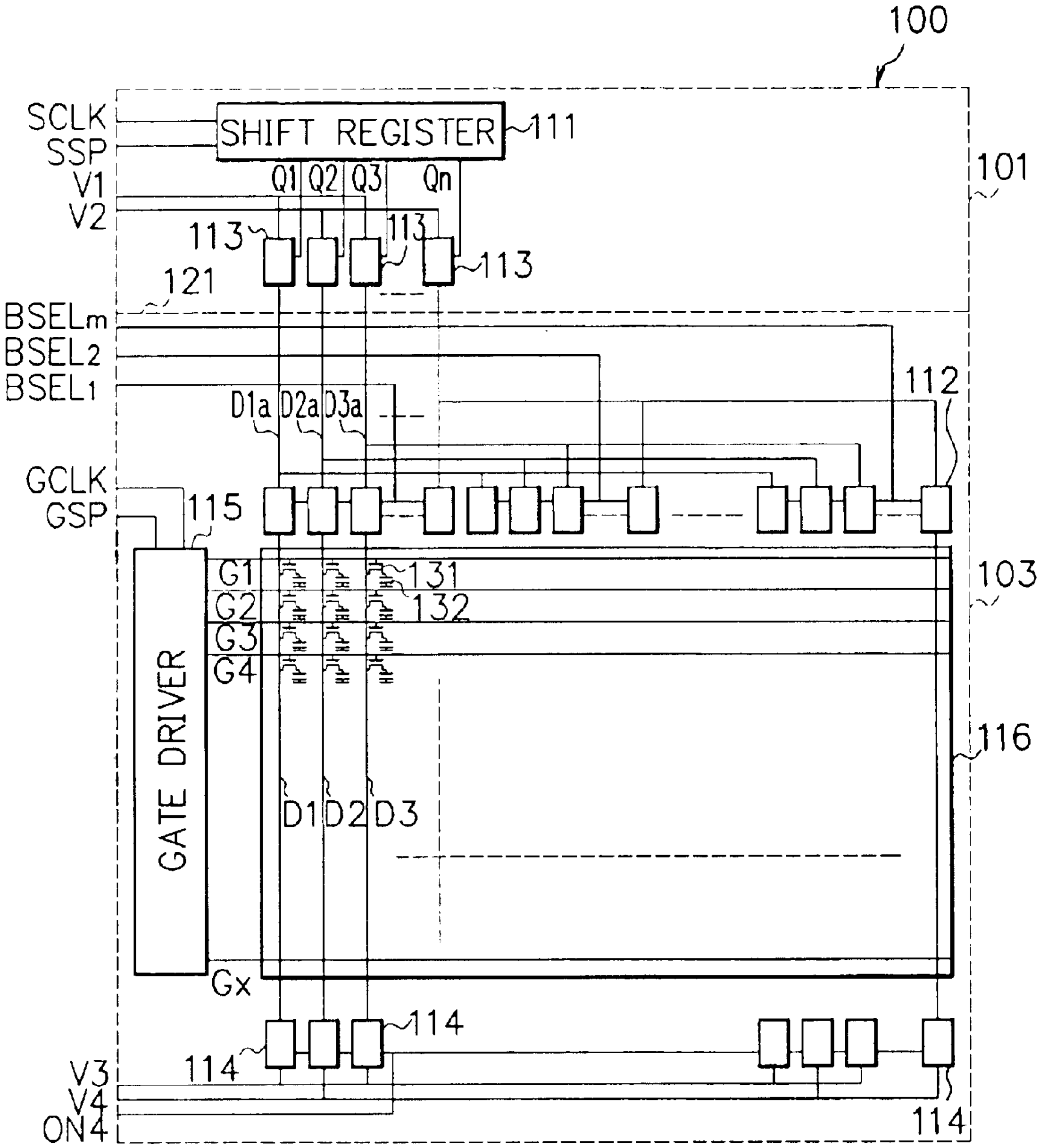
FIG. 5 is a diagram showing a liquid crystal display substrate according to a second embodiment of the present invention.

FIG. 5 shows the liquid crystal display substrate 100 according to the second embodiment of the present invention. The second embodiment differs from the first embodiment in that the second inspection circuit is included in the display circuit 103 and signal lines V3 and V4 are alternately connected to the other ends of the input/output terminals of the analog switches 114, and the other points are the same.

Different inspection signals are inputted to the signal lines V3 and V4 for operation at the timing in FIG. 3 as in the first embodiment. In this event, if, for example, the data lines D1 and D2 short-circuit to each other, or the data lines D1*a* and D2*a* short-circuit to each other, the same signal is detected in the signal lines V1 and V2. On the other hand, if the data lines D1 and D2 do not short-circuit to each other and the data lines D1*a* and D2*a* do not short-circuit to each other, the inspection signal inputted to the signal line V3 is detected in the signal line V1, and the inspection signal inputted to the signal line V4 is detected in the signal line V2. The existence of a short circuit between adjacent data lines can be checked as described above.

Further, the signal lines V3 and V4 can be used as precharge functions during normal operation. Polarities of data on the data lines D1 to D3 and so on are preferably opposite, positive and negative, between even-numbered lines and odd-numbered lines to prevent image flicker and the like. In this event, the data lines D1 to D3 and so on can be precharged by inputting voltages with opposite polarities to the signal lines V3 and V4 before the data is outputted to the output lines Q1 to Qn of the data driver 401.

Third Embodiment

Figure 6:
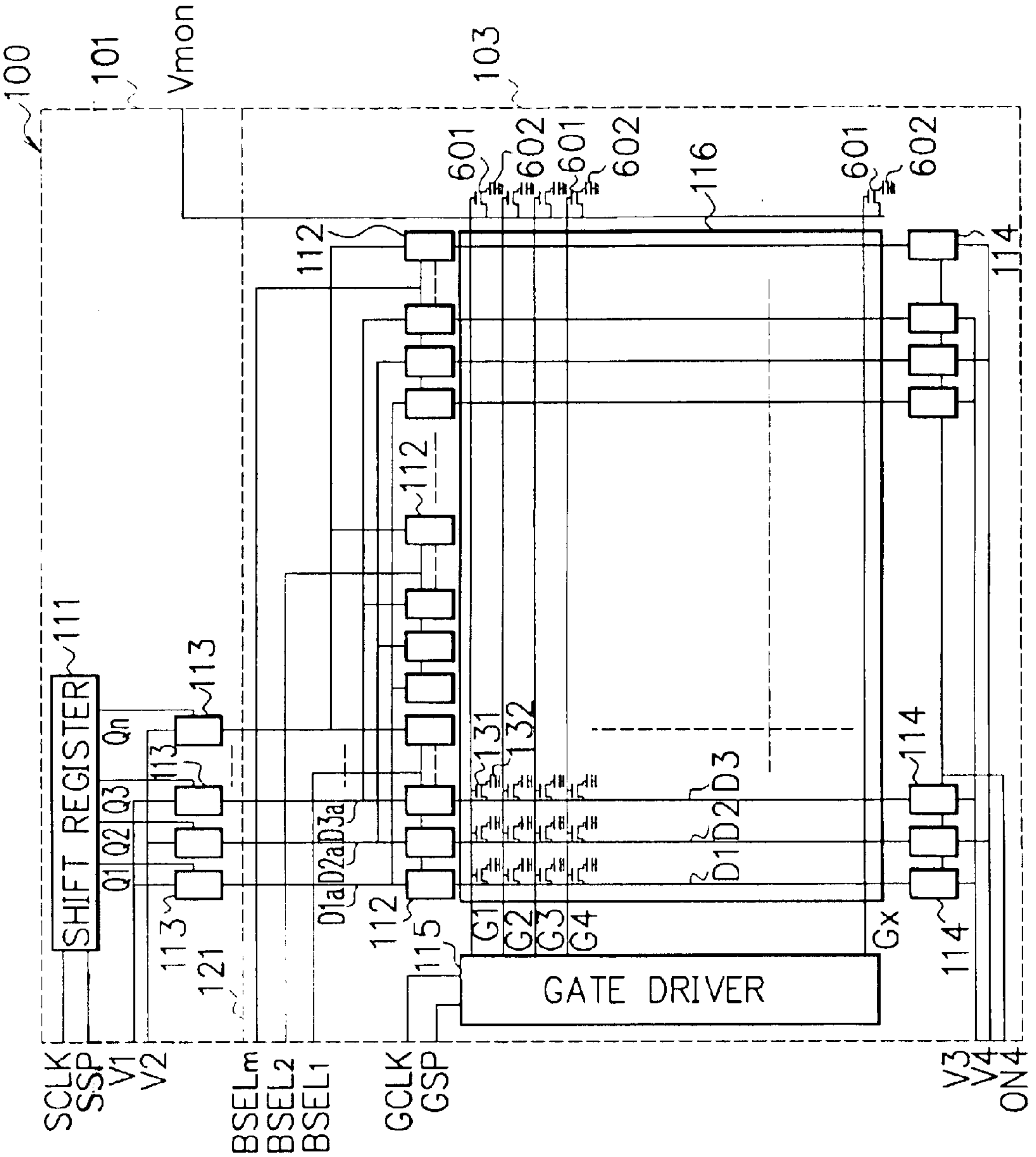
FIG. 6 is a diagram showing a liquid crystal display substrate according to a third embodiment of the present invention.

FIG. 6 shows the liquid crystal display substrate 100 according to the third embodiment of the present invention. The third embodiment differs from the second embodiment in that n-channel MOS transistors 601 and capacitors (condensers) 602 are provided, and the other points are the same.

In the transistors 601, gates are connected to the scanning lines G1 to Gx respectively, drains are connected to a common signal line Vmon, and sources are connected to a common voltage terminal via the capacitors 602.

Figure 7:
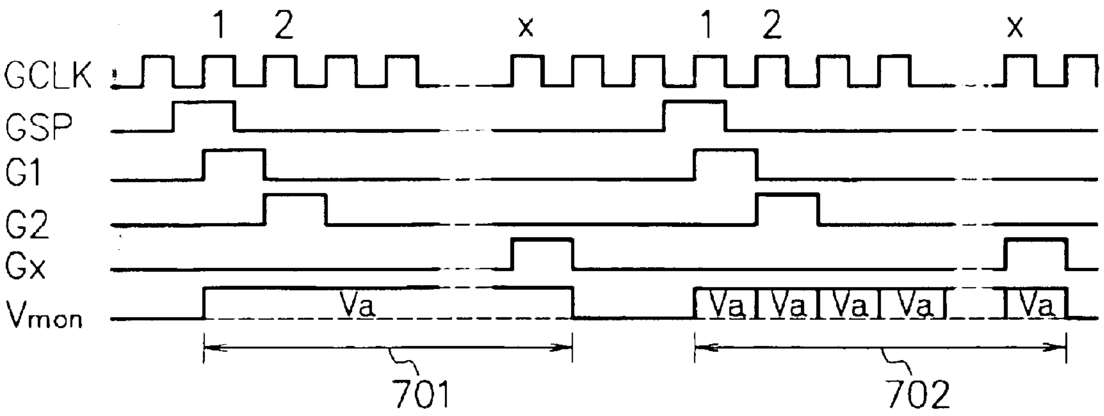
FIG. 7 is a timing chart showing a first inspection method according to the third embodiment.

FIG. 7 is a timing chart showing the inspection method. The gate driver 115 outputs the scanning signals sequentially to the scanning lines G1 to Gx in response to clocks GCLK and start pulse GSP. During a period 701 of the output, an inspection voltage Va is inputted to the signal line Vmon. The transistors 601 turn on when the scanning lines G1 to Gx are set to the high level respectively to store the inspection voltage Va in the capacitors 602.

Next, the start pulse GSP is inputted again to output the scanning signals sequentially to the scanning lines G1 to Gx. During a period 702 of the output, an output of the signal line Vmon is detected. If the inspection voltage Va is detected in the signal line Vmon while each of the scanning lines G1 to Gx is at the high level, all of the scanning lines G1 to Gx can be verified as not broken. On the other hand, if there is a period during which the inspection voltage Va is not detected in the signal line Vmon in the period 702, the scanning line corresponding to the period can be verified as broken. According to this embodiment, a break in the scanning lines G1 to Gx can be detected as a defect point.

Figure 8:
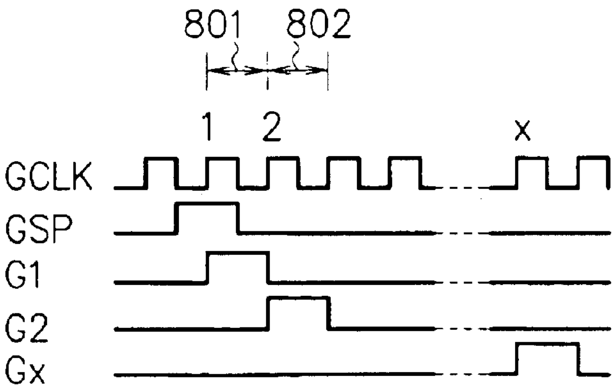
FIG. 8 is a timing chart showing a second inspection method according to the third embodiment.
Figure 9:
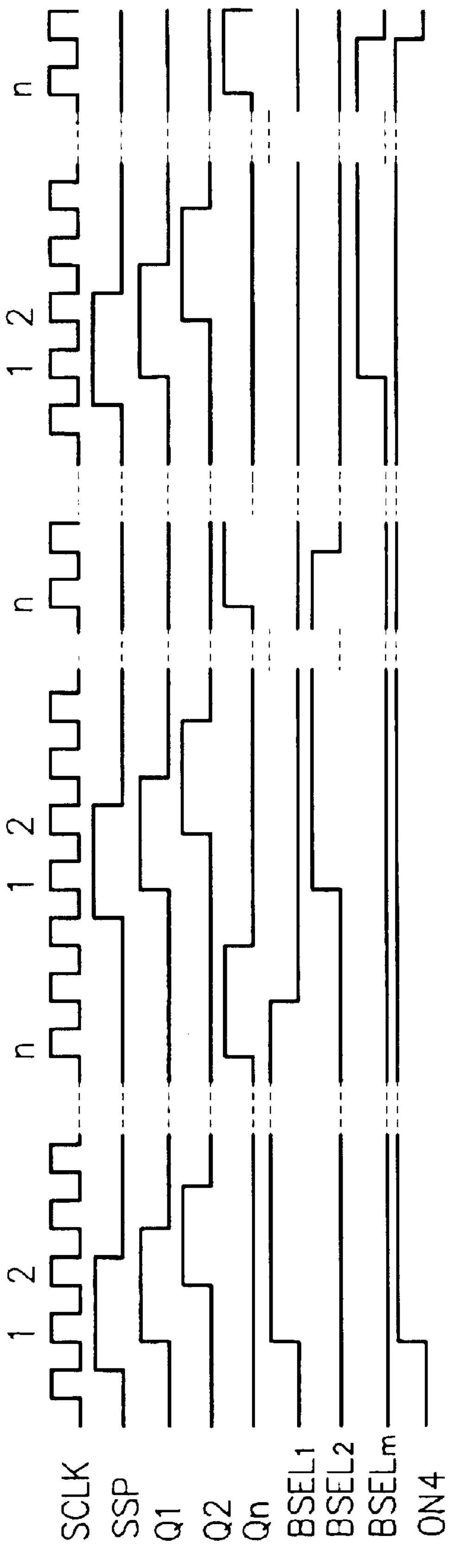
FIG. 9 is another timing chart showing the second inspection method according to the third embodiment.

FIG. 8 is a timing chart showing another inspection method which is performed after the above-described inspection. The clock GCLK, the start pulse GSP, and the scanning lines G1 to Gx are the same as those in FIG. 7. Periods 801 and 802 are periods during which the scanning lines G1 and G2 are at the high level respectively. During the periods 801 and 802, processing shown in FIG. 9 is performed respectively. Also in periods during which other scanning lines G3 to Gx are set to the high level, processing is similarly performed at the timing shown in FIG. 9.

In FIG. 9, the clock SCLK, the start pulse SSP, and the control lines Q1 to Qn are the same as those in FIG. 3. While the control line ON4 is at the high level, the block selection signal lines BSEL1 to BSELm are sequentially set to the high level. While each of the block selection signal lines BSEL1 to BSELm is at the high level, the control lines Q1 to Qn sequentially turn to the high level.

For example, both the control lines Q1 and Q2 turn to the high level as shown in FIG. 9 while the scanning line G1 is at the high level as shown in FIG. 8. The analog switches 113 connect the signal line V1 and the data line D1*a*, and the signal line V2 and the data line D2*a*. Since the block selection signal line BSEL1 is at the high level in this event, the analog switches 112 connect the data lines D1*a* and D1, and the data lines D2*a* and D2. Since the control line ON4 is at the high level, the analog switches 114 connect the data line D1 and the signal line V3, and the data line D2 and the signal line V4.

Similarly to the second embodiment, different inspection signals are inputted to the signal lines V3 and V4. If the lines G1 and D1 do not short-circuit to each other, and the lines G2 and D2 do not short-circuit to each other, the inspection signals inputted to the signal lines V3 and V4 can be detected in the signal lines V1 and V2 respectively. On the other hand, if the lines G1 and D1 short-circuit to each other, or the lines G2 and D2 short-circuit to each other, voltages affected by the scanning line G1 or G2 are detected in the signal lines V1 and V2. The existence of a short circuit between adjacent pixels can also be checked at that time. According to this embodiment, a defect such as a short circuit between the scanning line and the data line and a short circuit between adjacent pixels can be detected.

Through the above-described inspection, a line defect of the liquid crystal display substrate can be inspected. Thereafter, a point defect of a pixel corresponding to each TFT (switching element) 131 of the display circuit 103 is inspected. This enables inspection of both the line defect and the point defect.

As described above, according to the first to third embodiments, the provision of the first and second inspection circuits together with the display circuit on the liquid crystal display substrate enables, before unitization of the liquid crystal display device, inspection of the existence of defects such as breaks in the data lines, short circuits between adjacent data lines, short circuits between the data lines between the analog switches 112 and the analog switches 113, breaks in the scanning lines, short circuits between adjacent pixels, short circuits to other signal lines, and the like. The separation of the first inspection circuit 101 after the inspection enables the data driver 401 to be connected to the display circuit 103, thereby providing a liquid crystal display device at a lower cost.

Fourth Embodiment

Figure 10:
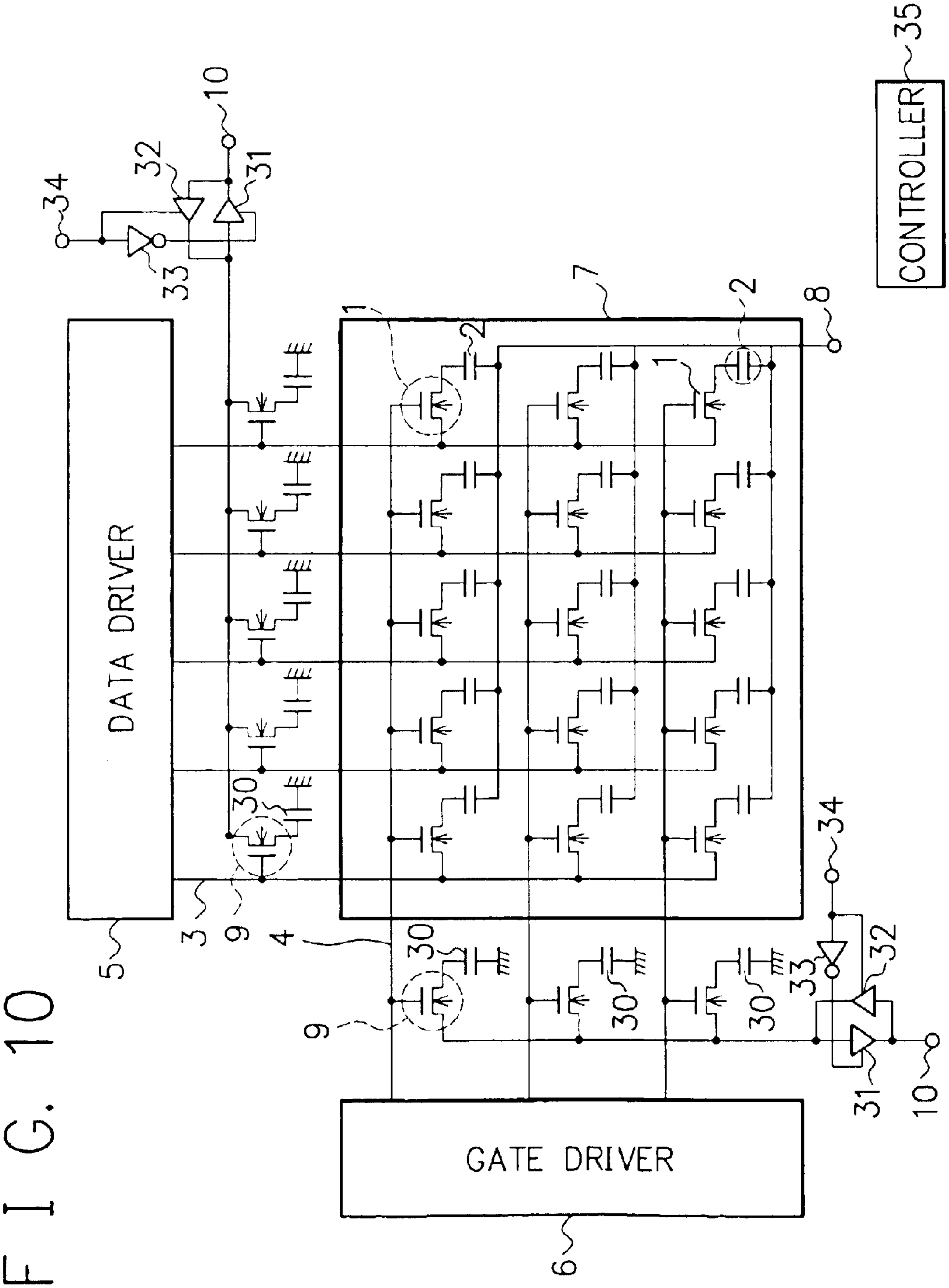
FIG. 10 is a diagram showing a liquid crystal display substrate according to a fourth embodiment of the present invention.

FIG. 10 shows a liquid crystal display substrate according to the fourth embodiment of the present invention. In a pixel region 7, gates of TFTs (n-channel MOS transistors) 1 are connected to scanning lines 4, drains are connected to data lines 3, and sources (pixel electrodes) are connected to an electrode 8 on an opposite substrate via liquid crystal capacitors 2. Between the pixel region 7 and a gate driver 6, and between the pixel region 7 and a data driver 5, inspection switching elements (n-channel MOS transistors) 9 are provided. Gates of the inspection switching elements 9 are connected to the scanning lines 4 or the data lines 3. In the switching elements 9, sources are connected to the ground via capacitors 30 and drains are connected to a common inspection terminal 10 via a buffer 31 or 32. The buffers 31 and 32 constitute a bidirectional switch. A control terminal of the buffer 32 is directly connected to a terminal 34. A control terminal of the buffer 31 is connected to the terminal 34 via an inverter 33. A controller 35 inputs a high level to the terminal 34 to make the inspection terminal 10 an input terminal, and inputs a low level to the terminal 34 to make the inspection terminal 10 an output terminal.

The data driver 5, a data supply circuit for supplying data to the data lines 3, may be analog switches. The gate driver 6 can supply scanning signals to the scanning lines 4.

Next, the inspection method is explained. The gate driver 6 or the data driver 5 first outputs a signal for turning on the inspection switching element 9. During a period during which the inspection switching element 9 is on, the controller 35 inputs an inspection signal to the inspection terminal 10 to charge (preset) the capacitor 30. The inspection switching element 9 is turned on again to detect from the inspection terminal 10 the voltage charged in the capacitor 30. If the inspection voltage can be detected, it can be judged that the gate driver 6 or the data driver 5 is operating normally, and that the scanning line 4 or the date line 3 from the gate driver 6 or the data driver 5 to the pixel region 7 is not broken and is acceptable. By repeating this inspection from the first line to the last line of the scanning lines 4 and the data lines 3 respectively, failures of the gate driver 6 and the data driver 5, and points and the number of breaks in the scanning lines 4 and the data lines 3, can be inspected.

Although the inspection switching elements 9 are arranged on the input sides (left and upper sides) of the pixel region 7 in this embodiment, they may be arranged on the output sides (right and lower sides). In the case of the arrangement on the output sides, breaks in the scanning lines 4 and the data lines 3 in the pixel region 7 can also be inspected. The aforementioned capacitors 30 may be separately provided for the respective inspection switching elements 9, or one capacitor 30 may be shared among the inspection switching elements 9. Alternatively, the capacitors 30 for the inspection switching elements 9 may be connected in parallel.

Fifth Embodiment

Figure 11:
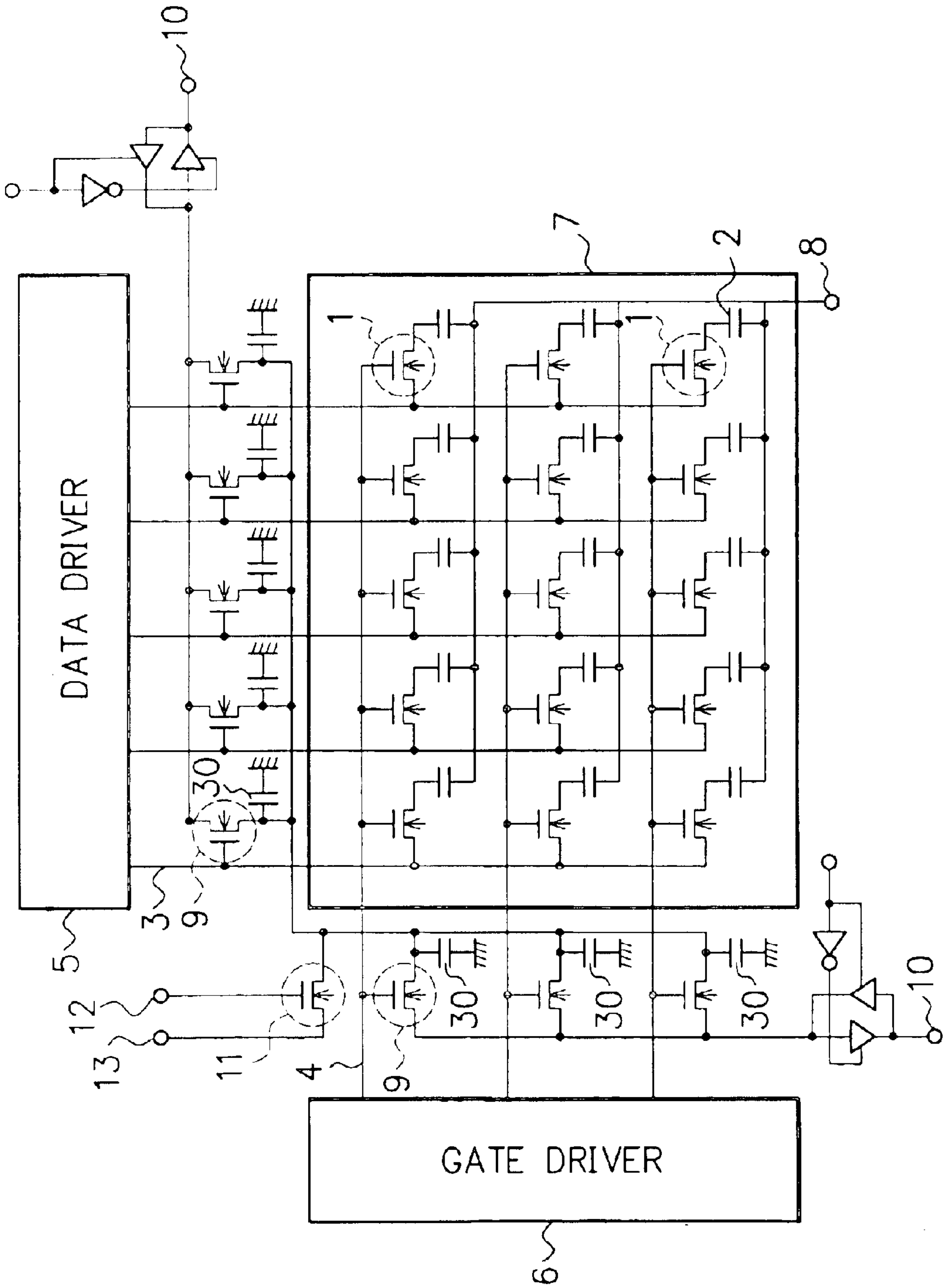
FIG. 11 is a diagram showing a liquid crystal display substrate according to a fifth embodiment of the present invention.

FIG. 11 shows a liquid crystal display substrate according to the fifth embodiment of the present invention. The fifth embodiment differs from the fourth embodiment in that a reset switch (n-channel MOS transistor) 11 is provided, and the other points are the same. In the reset switch 11, a gate is connected to an ON-OFF signal terminal 12, a drain is connected to a reset data input terminal 13, and a source is connected to each source of the inspection switching elements 9.

For the inspection, the ON-OFF signal terminal 12 is first set to a high level to turn on the reset switch 11, and the reset data input terminal 13 is set to the ground level to remove the charges in the capacitors 30. Then, the inspection shown in the fourth embodiment is performed. The reset of the capacitors 30 enables appropriate detection of the inspection voltage, resulting in improved accuracy of inspection.

Sixth Embodiment

Figure 12:
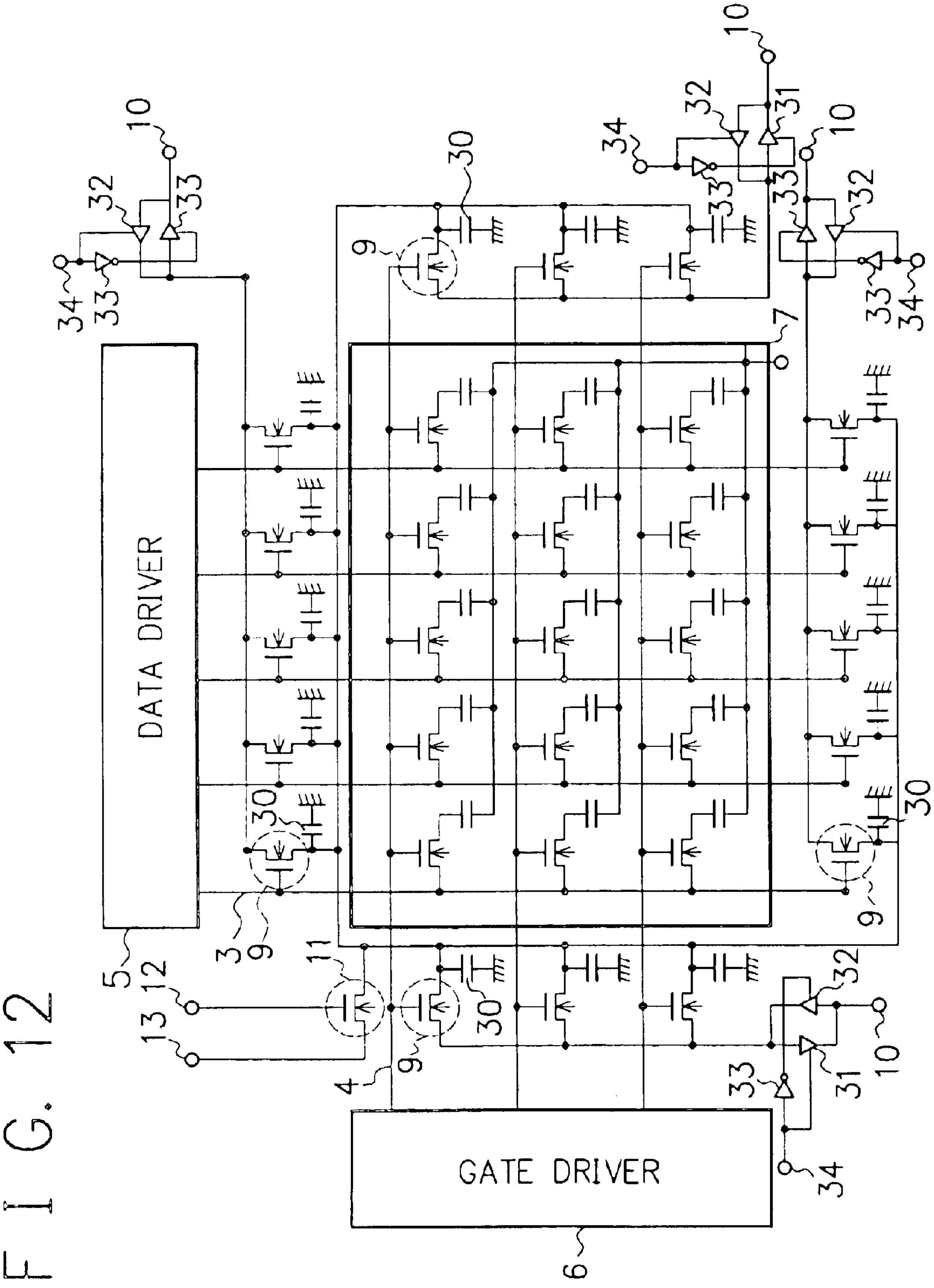
FIG. 12 is a diagram showing a liquid crystal display substrate according to a sixth embodiment of the present invention.

FIG. 12 shows a liquid crystal display substrate according to the sixth embodiment of the present invention. Only the points of the sixth embodiment differing from the fifth embodiment are explained. The inspection switching elements 9 are provided not only at the upper and left sides of the pixel region 7, but also at the right and lower sides. More specifically, the inspection switching elements 9 are provided at the output end of the pixel region 7 with respect to the gate driver 6 and at the output end of the pixel region 7 with respect to the data driver 5. In the inspection switching elements 9, similarly to the above explanation, the gates are connected to the scanning lines 4 or the data lines 3, the drains are connected to the inspection terminals 10 via the buffer 31 or 32, and the sources are connected to the ground via the capacitors 30. The reset data input terminal 13 is connected to the sources of the inspection switching elements 9 via the reset switch 11.

The same inspection as that in the fifth embodiment is performed. If the charge stored in the capacitor 30 can normally be detected from the inspection terminals 10 at the input sides (left and upper sides) of the pixel region 7, it can be judged that the gate driver 6 and the data driver 5 are operating normally, and that the scanning line 4 and the date line 3 from the gate driver 6 or the data driver 5 to the pixel region 7 are not broken and are acceptable.

If the charge stored in the capacitor 30 can normally be detected from the inspection terminals 10 at the output sides (right and lower sides) of the pixel region 7, it can be judged that the scanning line 4 and the date line 3 in the pixel region 7 are not broken and are acceptable.

By repeating this inspection from the first line to the last line of the gate driver 6 and the data driver 5, failures of the gate driver 6 and/or the data driver 5, and points and the number of breaks in the scanning lines 4 and/or the data lines 3, can be inspected.

Seventh Embodiment

Figure 13:
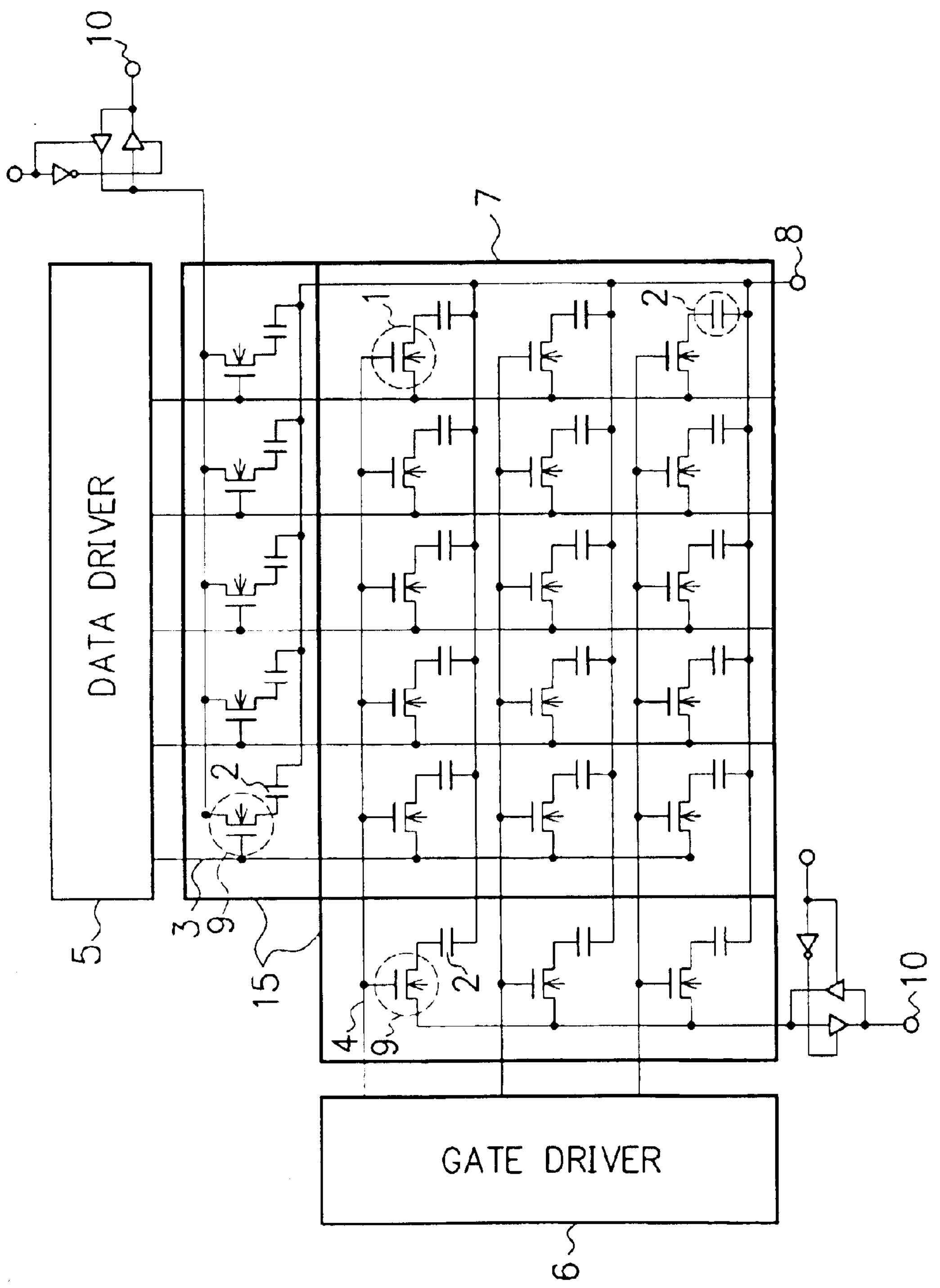
FIG. 13 is a diagram showing a liquid crystal display substrate according to a seventh embodiment of the present invention.

FIG. 13 shows a liquid crystal display substrate according to the seventh embodiment of the present invention. The seventh embodiment shows a case in which the inspection switching elements 9 in the fourth embodiment (FIG. 10) are inspection pixels 15. In other words, the inspection switching elements 9 in this case are the same TFTs as the TFTs 1 in the pixel region 7. The sources (pixel electrodes) of the inspection switching elements 9 are connected to the electrode 8 on the opposite substrate via the liquid crystal capacitors 2.

Although the capacitors 30 are charged with the inspection voltage in the fourth to sixth embodiments, the liquid crystal capacitors 2 are charged with the inspection voltage in this embodiment. The liquid crystal capacitor 2 has a large storable capacity as compared to the capacitor 30, which facilitates judgement at the time of inspection. During normal operation after the inspection, black data is written in the inspection pixels 15, which causes a decrease in contrast, and therefore the inspection pixels 15 are preferably shielded from light in advance.

Eighth Embodiment

Figure 14:
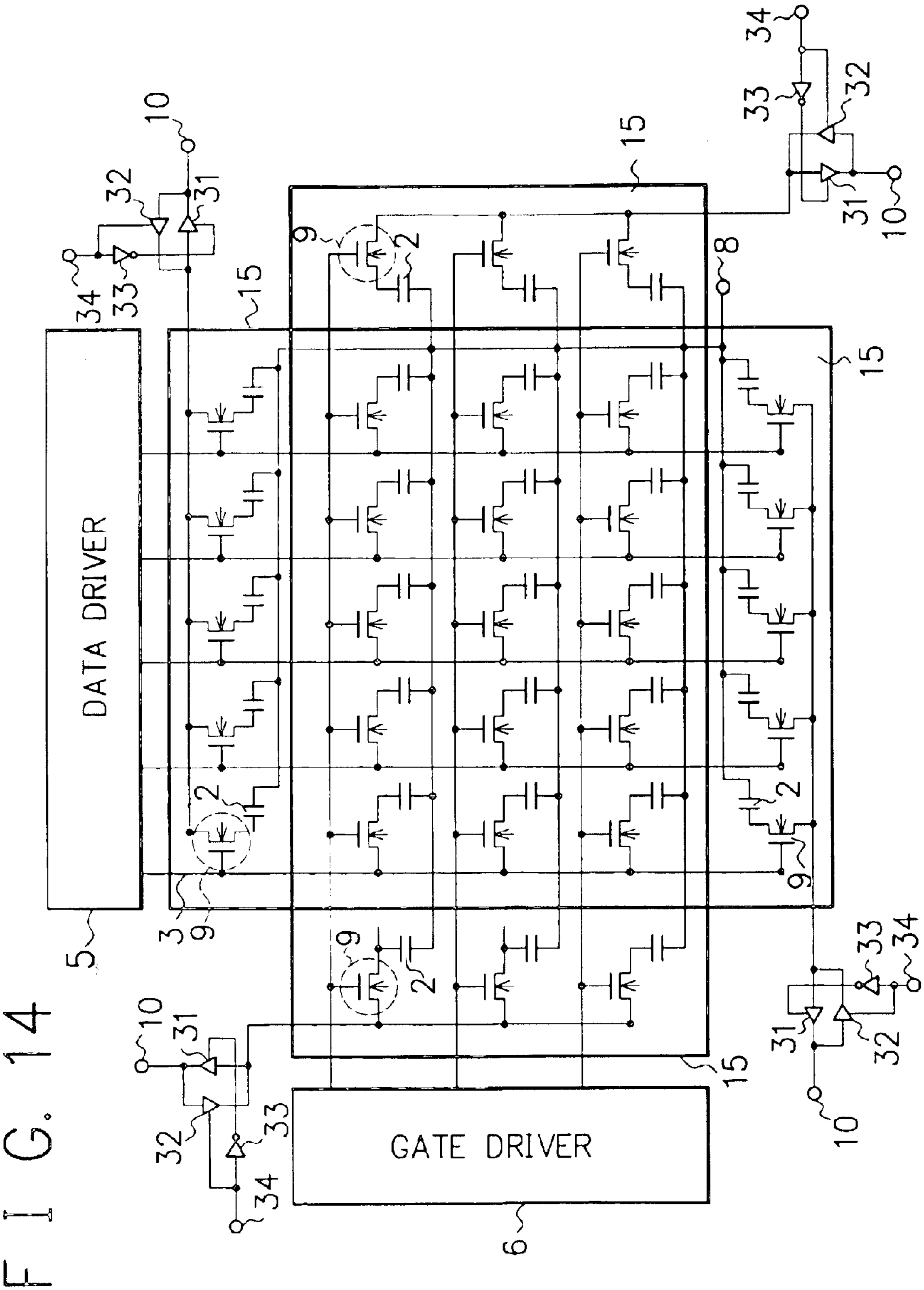
FIG. 14 is a diagram showing a liquid crystal display substrate according to an eighth embodiment of the present invention.

FIG. 14 shows a liquid crystal display substrate according to the eighth embodiment of the present invention. The point of the eighth embodiment differing from the seventh embodiment is explained. The inspection switching elements 9 which are the inspection pixels 15 are provided, as in the sixth embodiment (FIG. 12), not only at the input sides (upper and left sides) of the pixel region 7 but also at the output sides (right and lower sides).

If the charge stored in the liquid crystal capacitor 2 can normally be detected from the inspection terminals 10 at the input sides (left and upper sides) of the pixel region 7, it can be judged that the gate driver 6 and the data driver 5 are operating normally, and that the scanning line 4 and the date line 3 from the gate driver 6 or the data driver 5 to the pixel region 7 are not broken and are acceptable.

If the charge stored in the liquid crystal capacitor 2 can normally be detected from the inspection terminals 10 at the output sides (right and lower sides) of the pixel region 7, it can be judged that the scanning line 4 and the date line 3 in the pixel region 7 are not broken and are acceptable.

Ninth Embodiment

Figure 15:
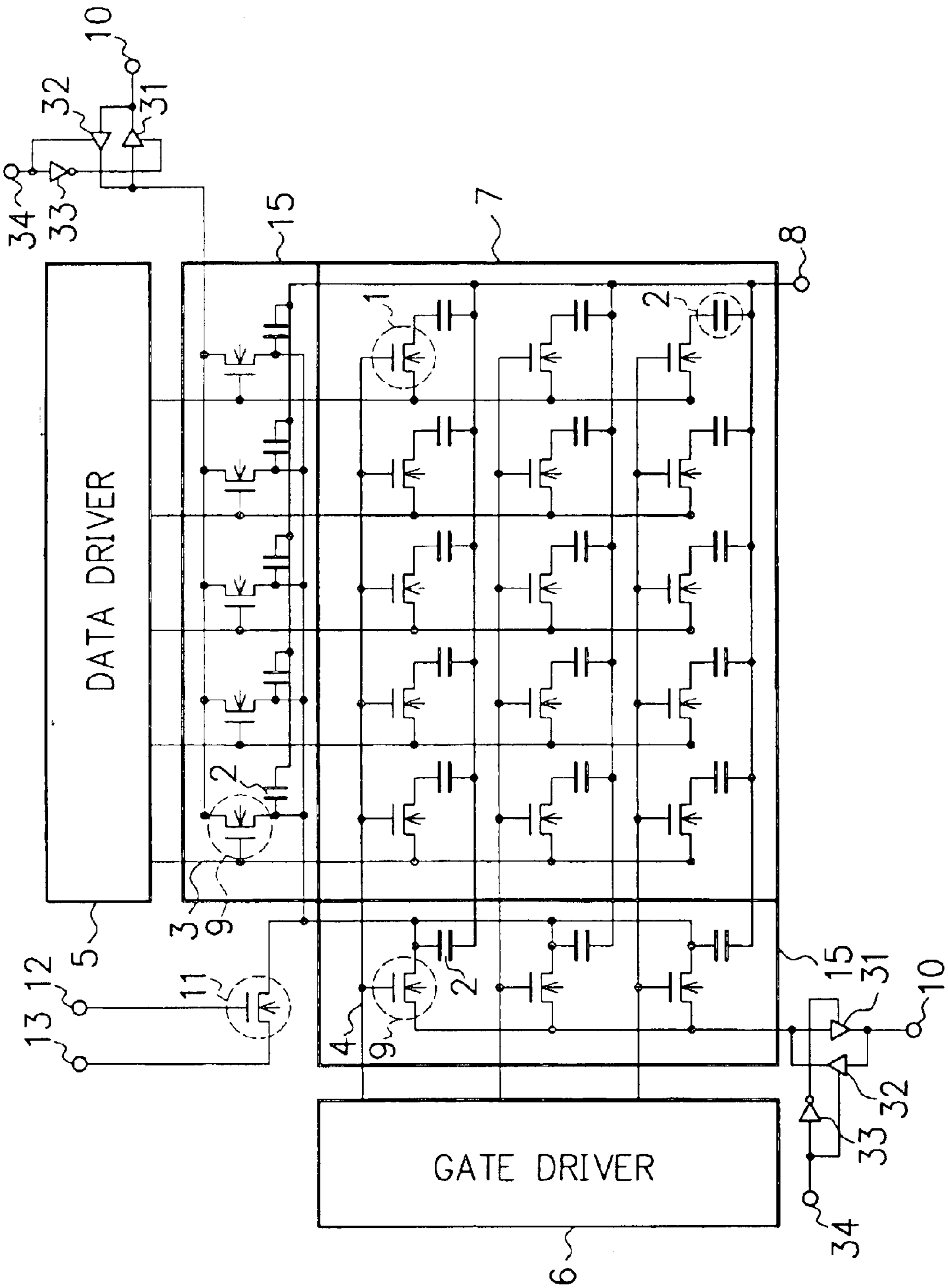
FIG. 15 is a diagram showing a liquid crystal display substrate according to a ninth embodiment of the present invention.

FIG. 15 shows a liquid crystal display substrate according to the ninth embodiment of the present invention. The ninth embodiment differs from the seventh embodiment in that the reset switch (n-channel MOS transistor) 11 is provided as in the fifth embodiment (FIG. 11), and the other points are the same. In the reset switch 11, the gate is connected to the ON-OFF signal terminal 12, the drain is connected to the reset data input terminal 13, and the source is connected to each source of the inspection switching elements 9 which are the inspection pixels.

For the inspection, the ON-OFF signal terminal 12 is first set to a high level to turn on the reset switch 11, and the reset data input terminal 13 is set to the ground level to remove the charges in the liquid crystal capacitors 2. Then, the inspection shown in the fourth embodiment is performed. The reset of the liquid crystal capacitors 2 enables improvement in accuracy of inspection.

Tenth Embodiment

Figure 16:
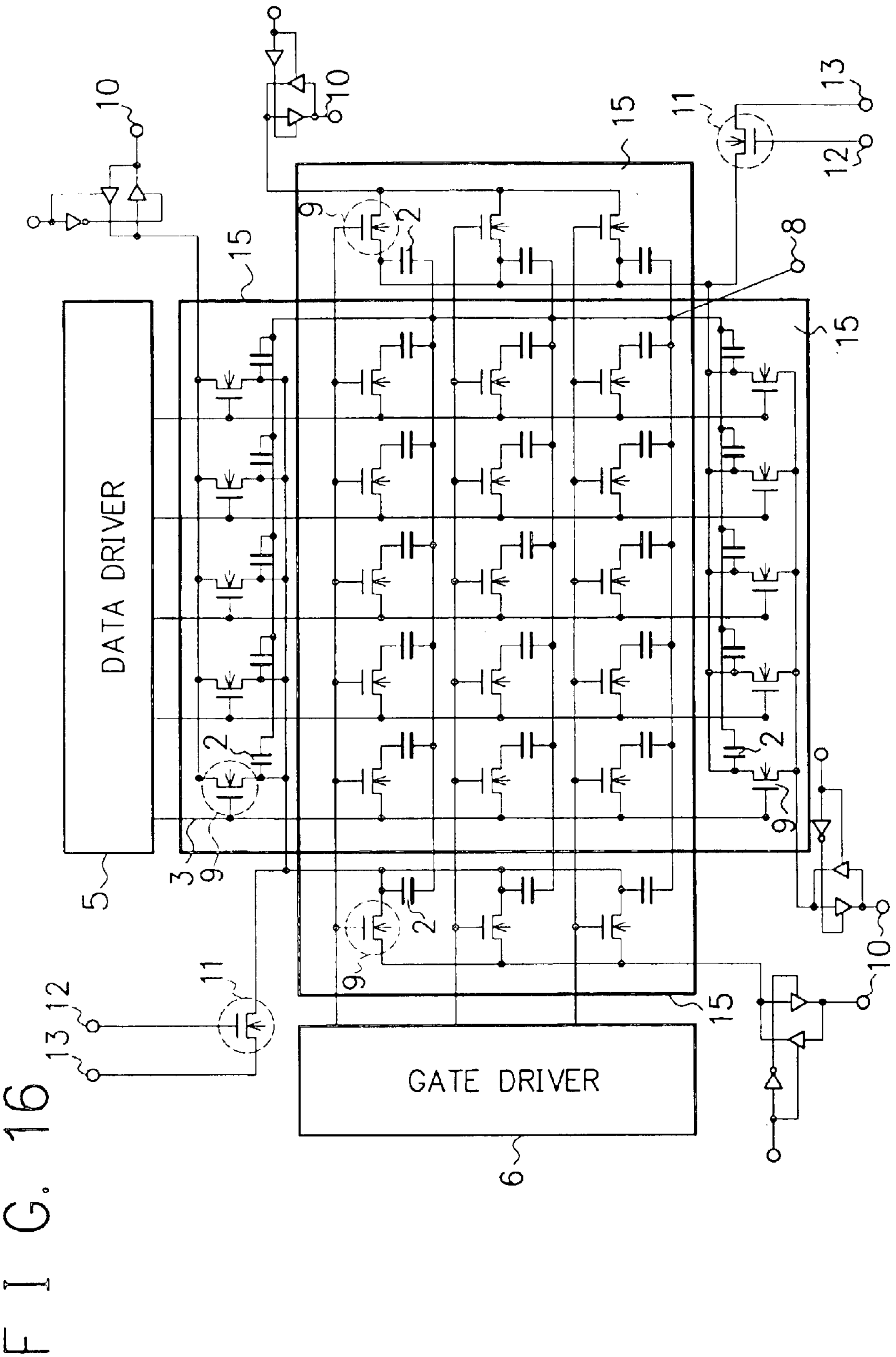
FIG. 16 is a diagram showing a liquid crystal display substrate according to a tenth embodiment of the present invention.

FIG. 16 shows a liquid crystal display substrate according to the tenth embodiment of the present invention. The tenth embodiment differs from the eighth embodiment (FIG. 14) in that the reset switches (n-channel MOS transistors) 11 are provided as in the ninth embodiment (FIG. 15), and the other points are the same. For the inspection, the ON-OFF signal terminals 12 are first set to a high level to turn on the reset switches 11, and the reset data input terminals 13 are set to the ground level to remove the charges in the liquid crystal capacitors 2. Then, the inspection shown in the fourth embodiment is performed.

Eleventh Embodiment

Figure 17:
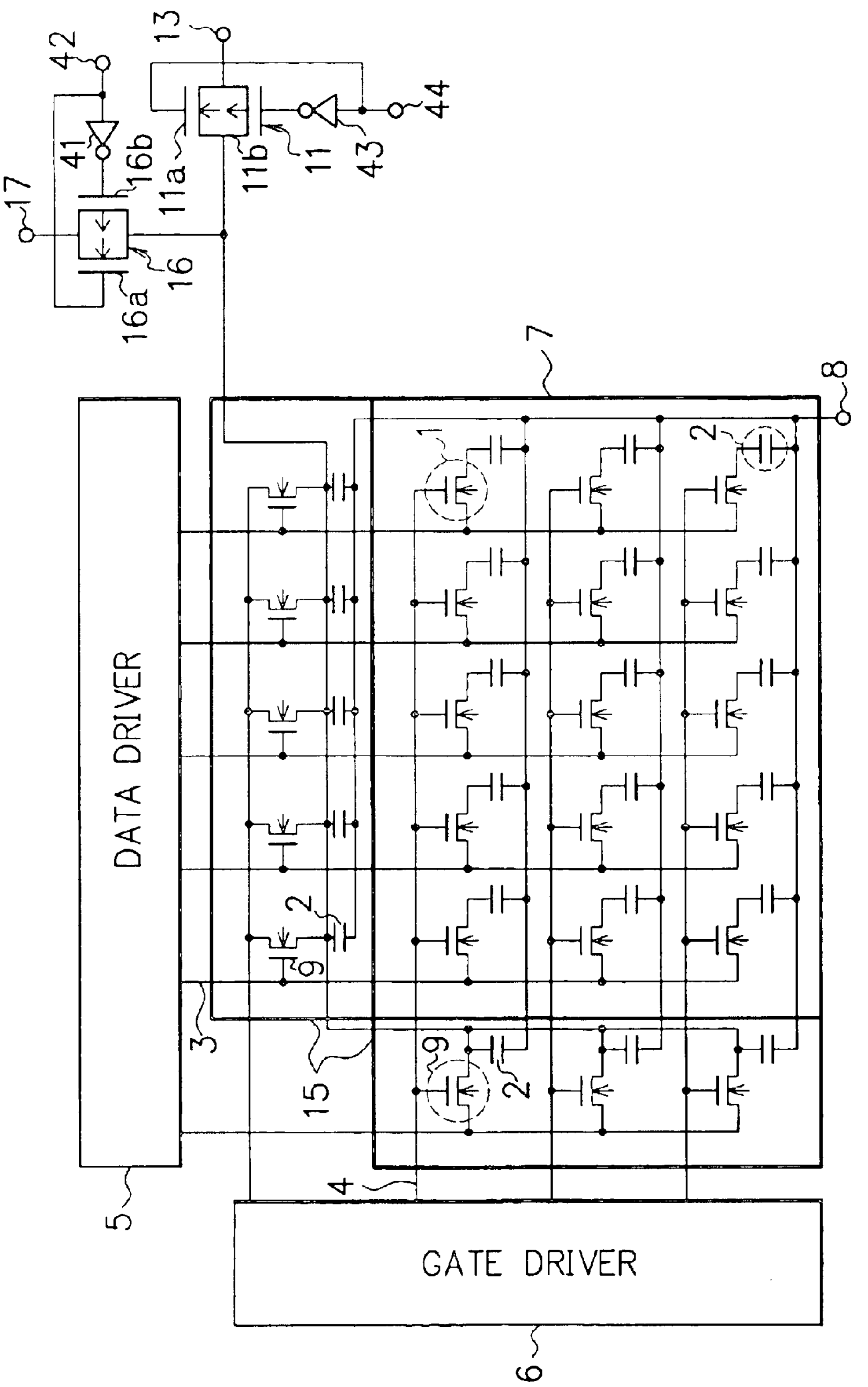
FIG. 17 is a diagram showing a liquid crystal display substrate according to an eleventh embodiment of the present invention.

FIG. 17 shows a liquid crystal display substrate according to the eleventh embodiment of the present invention. The point of the eleventh embodiment differing from the ninth embodiment (FIG. 15) is explained. The inspection switching elements 9 which are the inspection pixels 15 are provided between the pixel region 7 and the gate driver 6 and between the pixel region 7 and the data driver 5. In the inspection switching elements 9, the gates are connected to the scanning lines 4 or the data lines 3, the drains are connected to the data lines 3 or the scanning lines 4, and the sources are connected to the electrode 8 on the opposite substrate via the liquid crystal capacitors 2. More specifically, in the inspection switching element 9, if the scanning line 4 is connected to the gate, the data line 3 is connected to the drain, and if the data line 3 is connected to the gate, the scanning line 4 is connected to the drain.

To the sources of the inspection switching elements 9 which are the inspection pixels 15, the reset data input terminal 13 is connected via the reset switch 11, and an inspection terminal 17 is connected via an inspection switch 16. The inspection switch 16 corresponds to the buffer 31 of the ninth embodiment (FIG. 15), and the inspection terminal 17 corresponds to the inspection terminal 10 of the ninth embodiment.

The reset switch 11, differing from that of the ninth embodiment, has a CMOS structure in which sources and drains of an n-channel MOS transistor 11*a* and a p-channel MOS transistor 11*b* are interconnected. A terminal 44 is connected to a gate of the transistor 11*b* via an inverter 43 and directly to a gate of the transistor 11*a*. When the terminal 44 is set to a high level, the reset switch 11 turns on, and when set at a low level, the reset switch 11 turns off.

The inspection switch 16 has a CMOS structure in which sources and drains of an n-channel MOS transistor 16*a* and a p-channel MOS transistor 16*b* are interconnected. A terminal 42 is connected to a gate of the transistor 16*b* via an inverter 41 and directly to a gate of the transistor 16*a*. When the terminal 42 is set to a high level, the inspection switch 16 turns on, and when set at a low level, the inspection switch 16 turns off.

Next, the inspection method is explained. The reset switch 11 is first turned on, and the data input terminal 13 is set at 0 V to remove the charges in the liquid crystal capacitors 2. Then, data is written in the liquid crystal capacitor 2 of the inspection switching element 9 which are the inspection pixel 15 from the gate driver 6 or the data driver 5. Subsequently, the inspection switch 16 is turned on to read the data written in the liquid crystal capacitor 2 from the inspection terminal 17. If the written data can be detected, it can be judged that the gate driver 6 or the data driver 5 is operating normally, and that the scanning line 4 and the date line 3 from the gate driver 6 or the data driver 5 to the pixel region 7 are not broken and are acceptable. By repeating this inspection from the first line to the last line of the gate driver 6 and the data driver 5, failures of the gate driver 6 and/or the data driver 5, and points and the number of breaks in the scanning lines 4 and/or the data lines 3, can be inspected.

Incidentally, the reset of the liquid crystal capacitors 2 and the preset of the inspection voltage may be performed by supplying data thereto from the data driver 5.

Twelfth Embodiment

Figure 18:
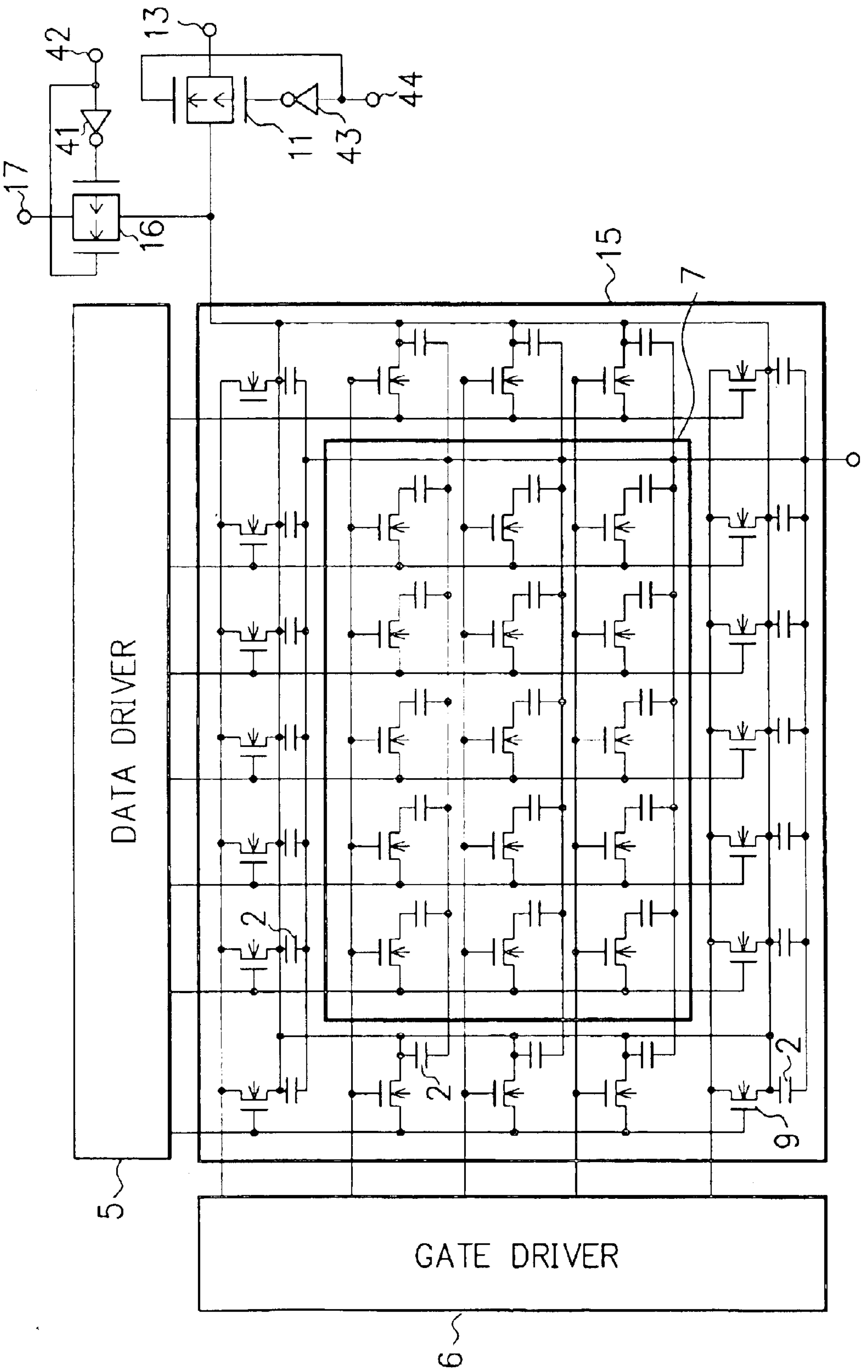
FIG. 18 is a diagram showing a liquid crystal display substrate according to a twelfth embodiment of the present invention.

FIG. 18 shows a liquid crystal display substrate according to the twelfth embodiment of the present invention. The point of the twelfth embodiment differing from the eleventh embodiment is explained. The inspection switching elements 9 which are the inspection pixels 15 are provided not only at the input sides (upper and left sides) but also at the output sides (right and lower sides) as in the eighth embodiment (FIG. 14).

If the charge stored in the liquid crystal capacitor 2 can normally be detected from the inspection terminal 17 at the input sides (left and upper sides) of the pixel region 7, it can be judged that the gate driver 6 and the data driver 5 are operating normally, and that the scanning line 4 and the date line 3 from the gate driver 6 or the data driver 5 to the pixel region 7 are not broken and are acceptable.

If the charge stored in the liquid crystal capacitor 2 can normally be detected from the inspection terminal 17 at the output sides (right and lower sides) of the pixel region 7, it can be judged that the scanning line 4 and the date line 3 in the pixel region 7 are not broken and are acceptable.

Incidentally, the reset of the liquid crystal capacitors 2 and the preset of the inspection voltage may be performed by writing data from the gate driver 6 or the data driver 5.

Thirteenth Embodiment

Figure 19:
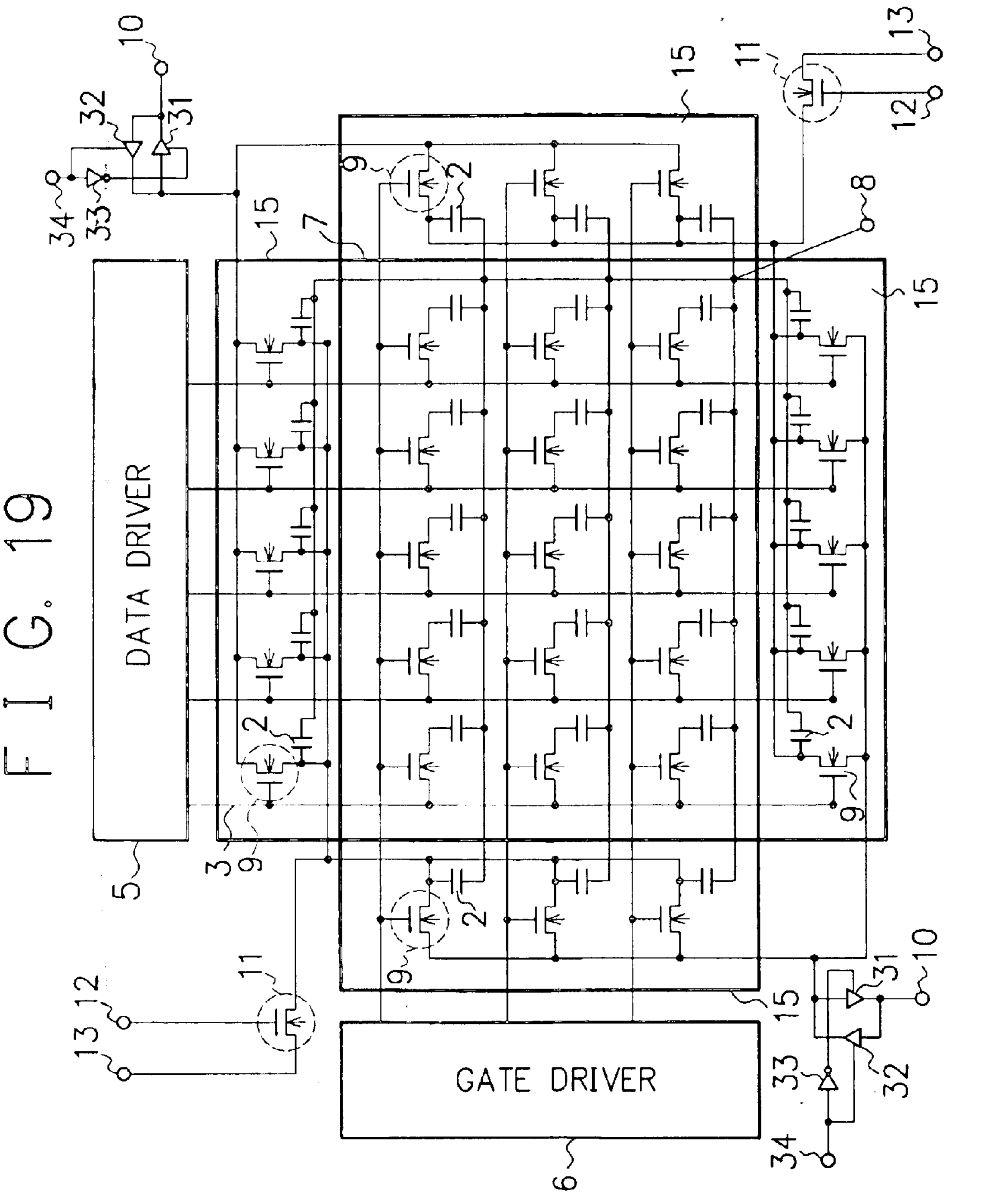
FIG. 19 is a diagram showing a liquid crystal display substrate according to a thirteenth embodiment of the present invention.

FIG. 19 shows a liquid crystal display substrate according to the thirteenth embodiment of the present invention. The point of the thirteenth embodiment differing from the tenth embodiment (FIG. 16) is explained. Although the inspection terminals 10 are provided separately for groups of the inspection switching elements 9 in four areas on the upper and lower and left and right sides of the pixel region 7 in the tenth embodiment, the inspection terminal 10 is provided which is shared between the groups of the inspection switching elements 9 in two areas on the left and lower sides of the pixel region 7, and the inspection terminal 10 is provided which is shared between the groups of the inspection switching elements 9 in two areas on the right and upper sides of the pixel region 7 in the thirteenth embodiment. According to this embodiment, the groups of the switching elements 9 in two areas can be controlled by the inspection terminal 10 and the reset data input terminal 13 each.

Fourteenth Embodiment

Figure 20:
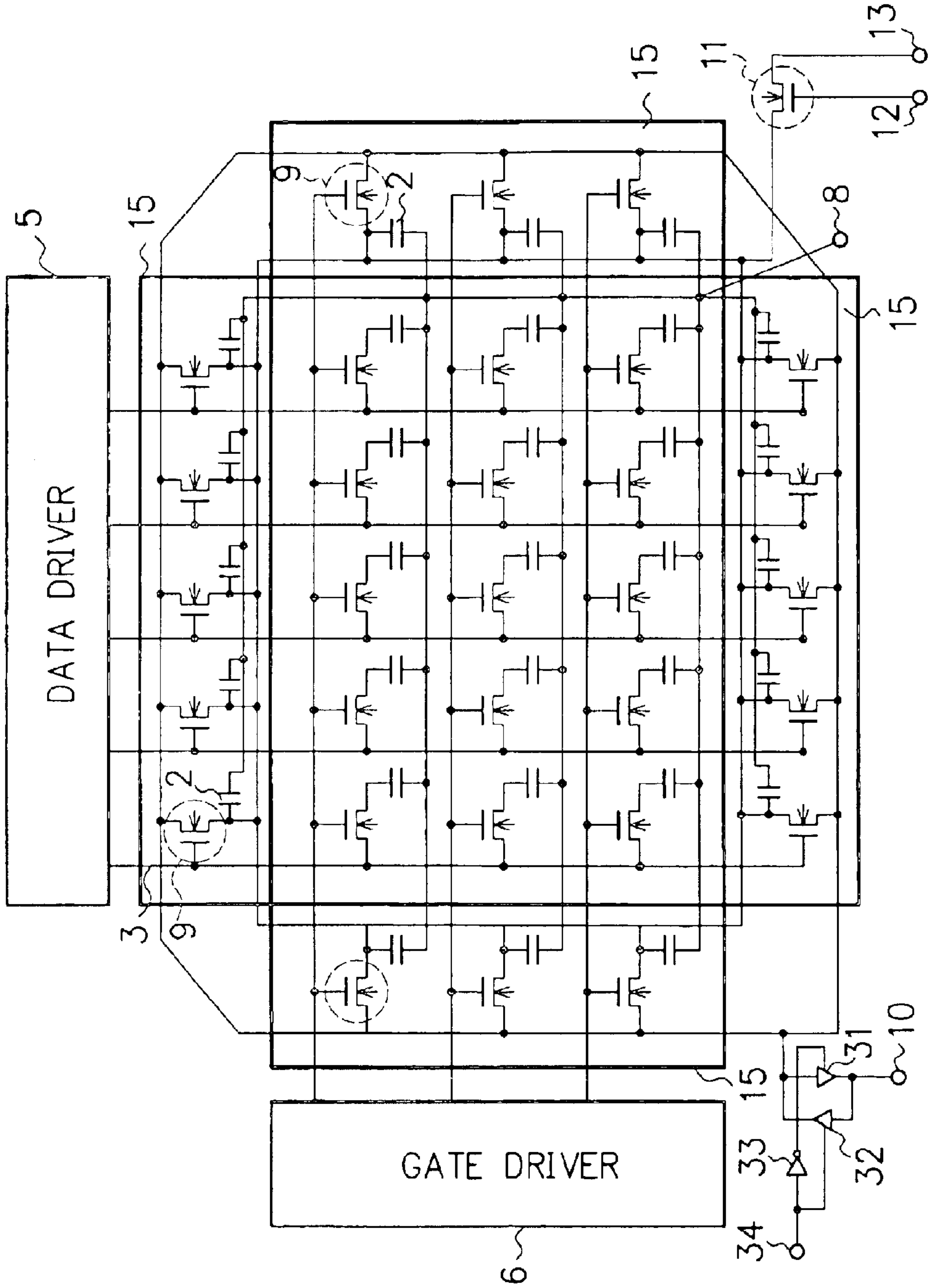
FIG. 20 is a diagram showing a liquid crystal display substrate according to a fourteenth embodiment of the present invention.

FIG. 20 shows a liquid crystal display substrate according to the fourteenth embodiment of the present invention. The point of the fourteenth embodiment differing from the thirteenth embodiment (FIG. 19) is explained. The inspection terminals 10 and the reset data input terminals 13 are provided which are shared between the groups of the inspection switching elements 9 in the two areas on the left and lower sides of the pixel region 7, and between the groups of the inspection switching elements 9 in the two areas on the right and upper sides of the pixel region 7 respectively in the thirteenth embodiment. In the fourteenth embodiment, the inspection terminal 10 and the reset data input terminal 13 are provided which are shared between the groups of the inspection switching elements 9 in the four areas on the upper and lower and left and right sides of the pixel region 7. According to this embodiment, the groups of the switching elements 9 in the four areas can be controlled by the inspection terminal 10 and the reset data input terminal 13 each.

Fifteenth Embodiment

Figure 21:
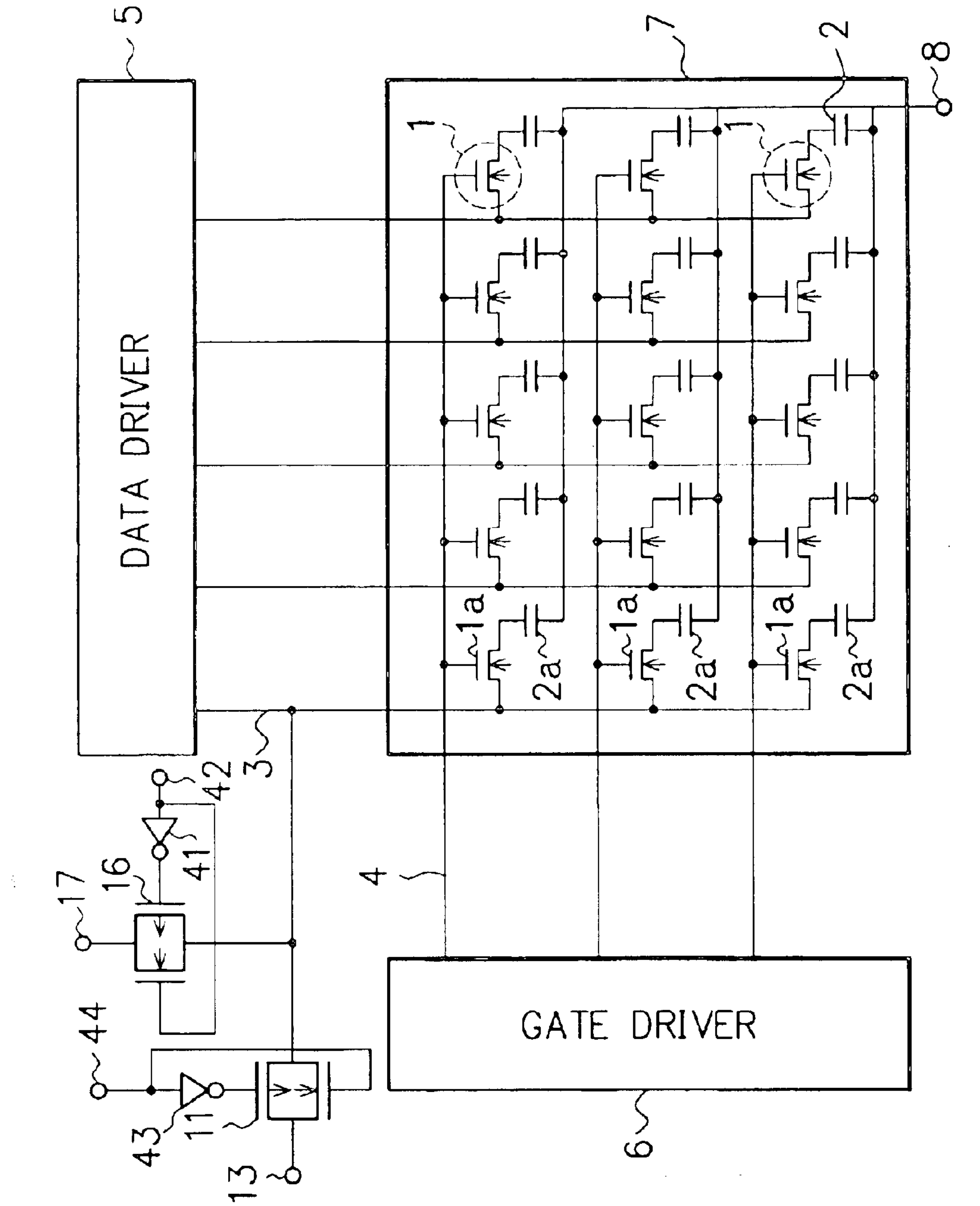
FIG. 21 is a diagram showing a liquid crystal display substrate according to a fifteenth embodiment of the present invention.

FIG. 21 shows a liquid crystal display substrate according to the fifteenth embodiment of the present invention. In the pixel region 7, the gates of the TFTs 1 are connected to the scanning lines 4, the drains are connected to the data lines 3, and the sources (pixel electrodes) are connected to the electrode 8 on the opposite substrate via the liquid crystal capacitors 2. The gate driver 6 outputs scanning signals to the scanning lines 4, and the data driver 5 outputs data to the data lines 3.

In this embodiment, TFTs 1*a* in a column at the left end in the pixel region 7 are used as inspection switching elements. To sources of the TFTs 1*a*, the electrode 8 on the opposite substrate is connected via liquid crystal capacitors 2*a*. To the data line 3 at the left end connected to the data driver 5, the reset data input terminal 13 is connected via the reset switch 11, and the inspection terminal 17 is connected via the inspection switch 16 as in the eleventh embodiment (FIG. 17).

The inspection method is explained. The charges in the liquid crystal capacitors 2*a* are removed through use of the reset switch 11 as in the eleventh embodiment. Then, the gate driver 6 turns on the TFT 1*a* to be inspected. During a period during which the TFT 1*a* is on, the data driver 5 supplies voltage to the liquid crystal capacitor 2*a* to charge it. Subsequently, the inspection switch 16 is opened to detect the voltage stored in the liquid crystal capacitor 2*a* from the inspection terminal 17. If the voltage can be detected at that time, it can be judged that the gate driver 6 and the data driver 5 are operating normally, and that the scanning line 4 and the date line 3 from the gate driver 6 or the data driver 5 to the TFT 1*a* are not broken and are acceptable.

Incidentally, the reset of the liquid crystal capacitors 2*a* may be performed by the data driver 5 in place of the reset by the reset data input terminal 13.

Sixteenth Embodiment

Figure 22:
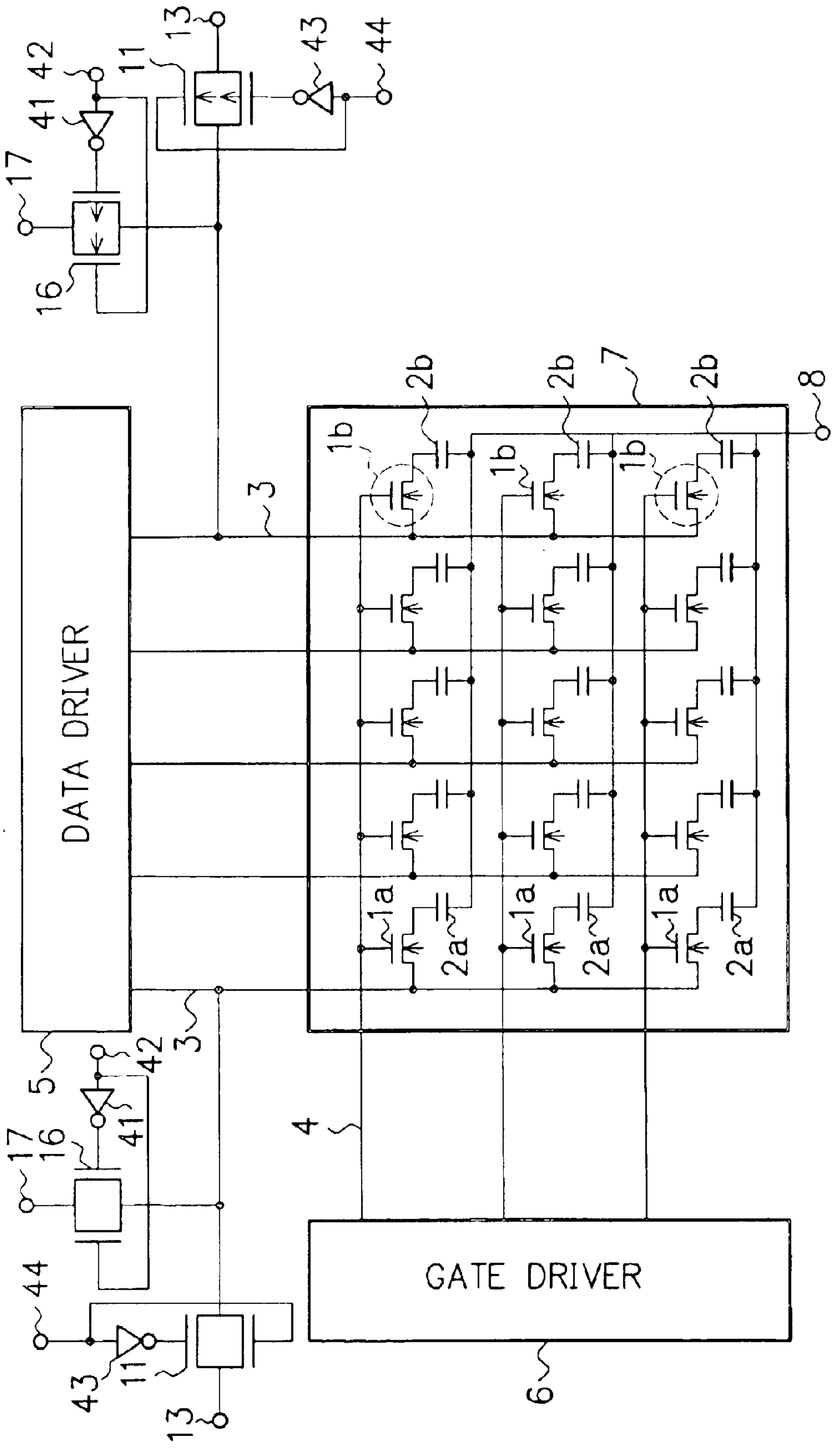
FIG. 22 is a diagram showing a liquid crystal display substrate according to a sixteenth embodiment of the present invention.

FIG. 22 shows a liquid crystal display substrate according to the sixteenth embodiment of the present invention. The point of the sixteenth embodiment differing from the fifteenth embodiment (FIG. 21) is explained. In addition to the group of the TFTs 1*a* at the left end (input end) in the pixel region 7, a group of TFTs 1*b* at the right end (output end) are used as inspection switching elements. Sources of the TFTs 1*b* are connected to the electrode 8 on the opposite substrate via liquid crystal capacitors 2*b*.

In addition to the data line 3 at the left end of the data driver 5, to the data line 3 at the right end, the inspection terminal 17 is connected via the inspection switch 16, and the reset data input terminal 13 is connected via the reset switch 11.

The inspection method is explained. The charges in the liquid crystal capacitors 2*a* or 2*b* are removed through use of the reset switches 11 as in the fifteenth embodiment. Then, the gate driver 6 turns on the TFT 1*a* and the TFT 1*b* of the pixels to be inspected. During a period during which the TFT 1*a* and the TFT 1*b* are on, the data driver 5 supplies voltage to the liquid crystal capacitors 2*a* and 2*b* to charge them. Subsequently, the inspection switches 16 are opened to detect the voltages stored in the liquid crystal capacitors 2*a* and 2*b* from each of the respective inspection terminals 17. This also enables the inspection of a break in the scanning line 4 in the pixel region 7.

Seventeenth Embodiment

Figure 23:
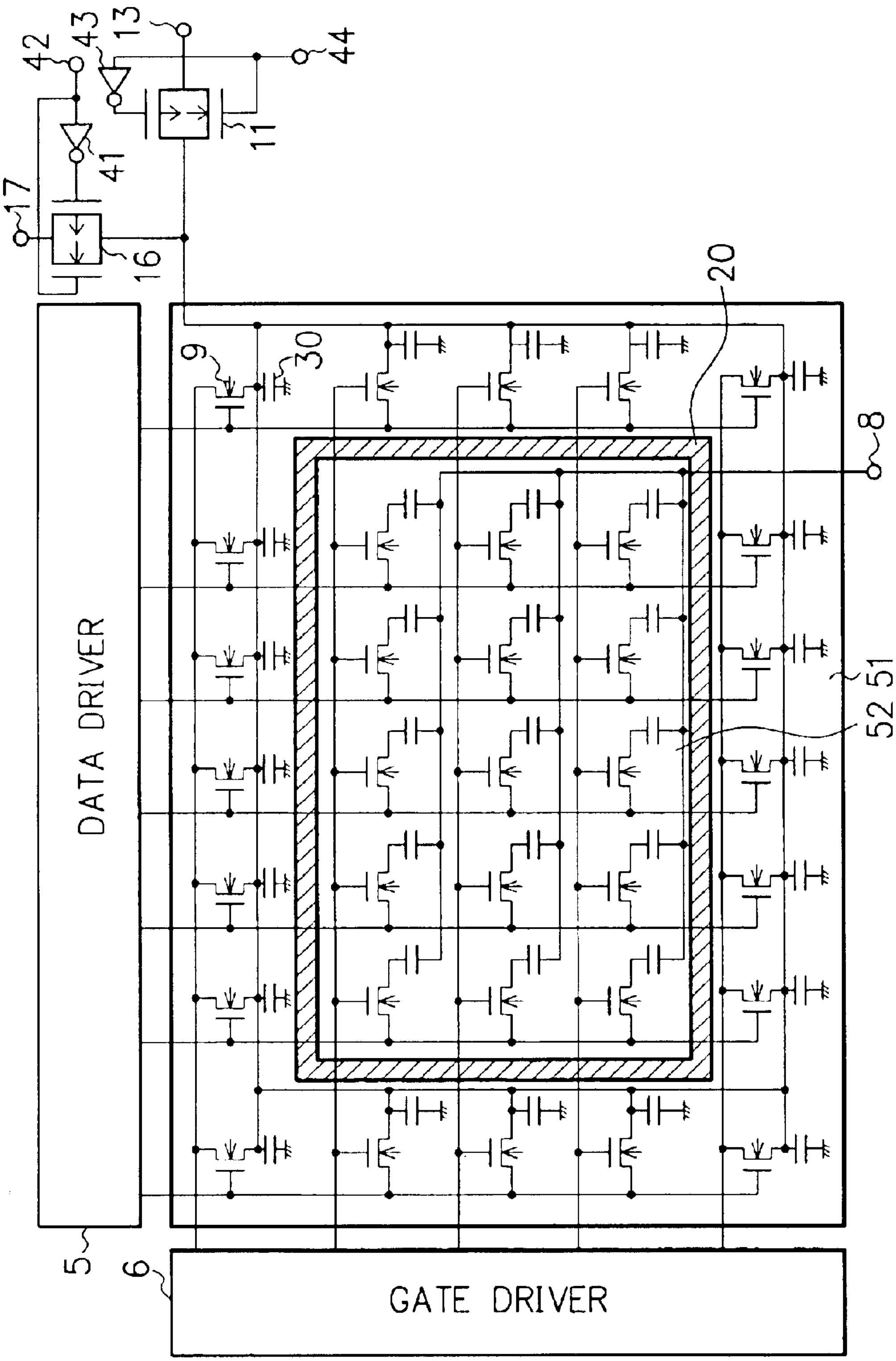
FIG. 23 is a diagram showing a liquid crystal display device according to a seventeenth embodiment of the present invention.

FIG. 23 shows a liquid crystal display device according to the seventeenth embodiment of the present invention. The seventeenth embodiment is a liquid crystal display device using the liquid crystal display substrate of the eleventh embodiment. The inspection switching elements 9, the capacitors 30, and the pixel region 7 are provided on a substrate 51. The common electrode 8 is provided on an opposite substrate 52. The substrate 51 and the opposite substrate 52 hold liquid crystal (capacitors 2) sandwiched therebetween, which in turn is sealed by a sealing part 20. The sealing part 20 is provided between the pixel region 7 and the inspection switching elements 9. The capacitors 30 connected to the inspection switching elements 9 are not the liquid crystal capacitors but newly formed capacitors because the capacitors 30 can not use the liquid crystal since they are outside the sealing part 20.

Eighteenth Embodiment

Figure 24:
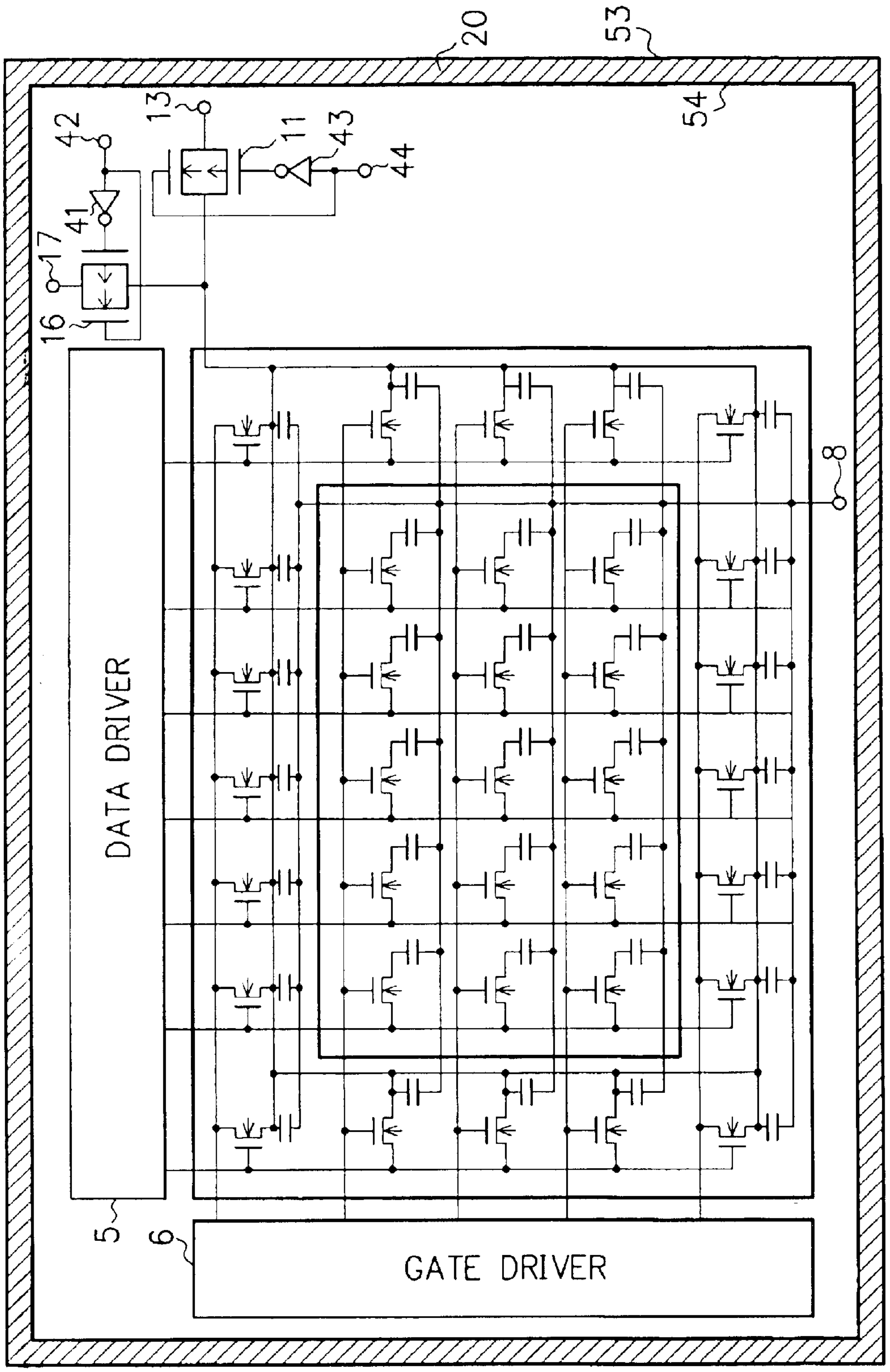
FIG. 24 is a diagram showing a liquid crystal display device according to an eighteenth embodiment of the present invention.

FIG. 24 shows a liquid crystal display device according to the eighteenth embodiment of the present invention. The point of the eighteenth embodiment differing from the seventeenth embodiment (FIG. 23) is explained. All of the above-described elements except for the common electrode 8 are provided on a substrate 53. The common electrode 8 is provided on an opposite substrate 54. The substrate 53 and the opposite substrate 54 hold the liquid crystal (capacitors 2) sandwiched therebetween, which in turn is sealed by the sealing part 20. The sealing part 20 is provided at the outer periphery of the liquid crystal display device. Since the inspection switching elements 9 are provided inside the sealing part 20, the inspection pixels are used as the inspection switching elements 9. The sources of the inspection switching elements 9 are connected to the electrode 8 on the opposite substrate via the liquid crystal capacitors 2.

In the case of the seventeenth embodiment (FIG. 23), since the gate driver 6, the data driver 5, and the inspection switching elements 9 are provided outside the sealing part 20, they are susceptible to breakage due to corrosion or other external factors. In the eighteenth embodiment, however, the gate driver 6, the data driver 5, and the inspection switching elements 9 can be protected since they are provided inside the sealing part 20. Further, the storable capacity of the inspection capacitor 30 is small in the seventeenth embodiment, but that of the liquid crystal capacitor 2 can be large in the eighteenth embodiment by virtue of use of the liquid crystal.

Nineteenth Embodiment

Figure 25:
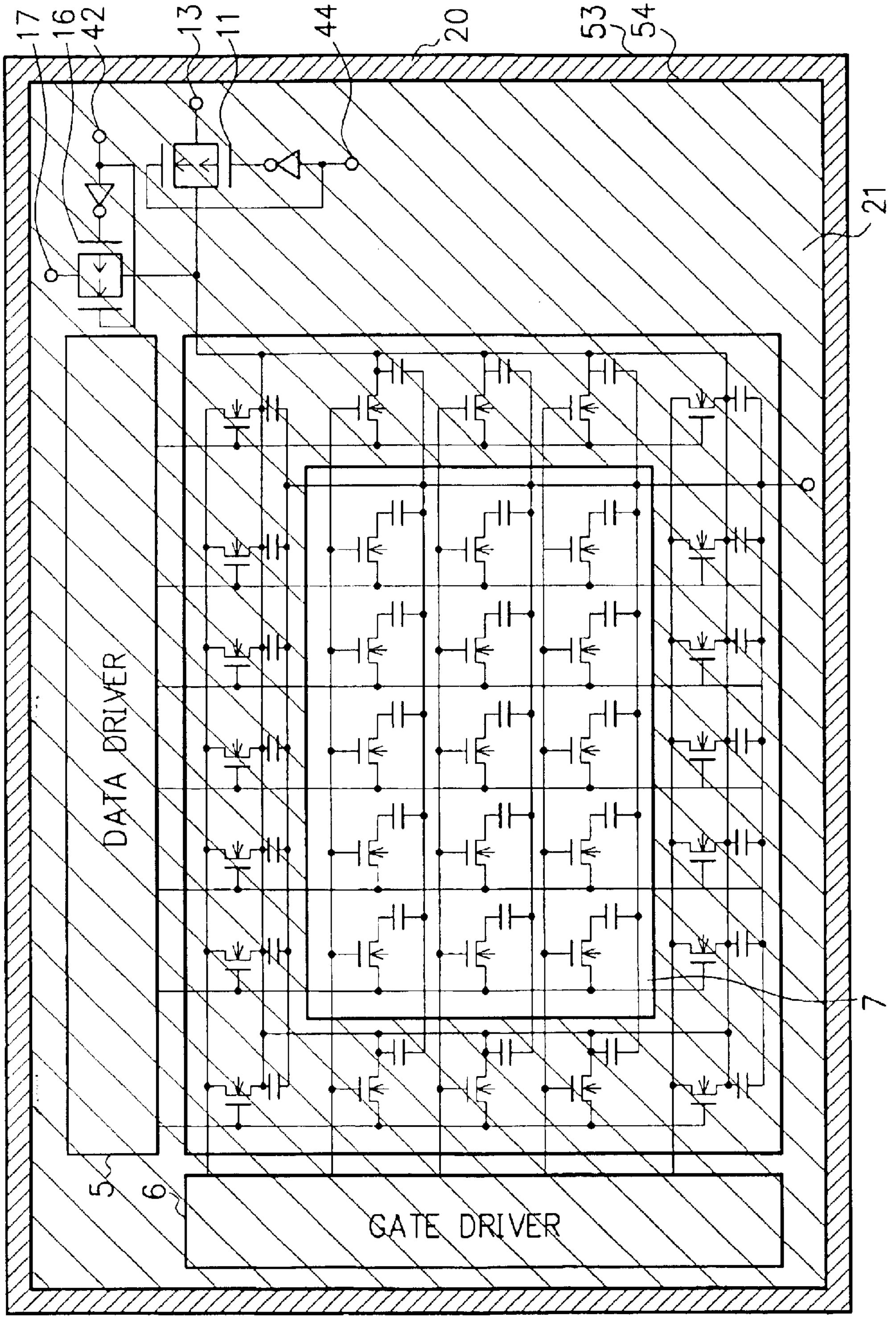
FIG. 25 is a diagram showing a liquid crystal display device according to a nineteenth embodiment of the present invention.
Figure 26:
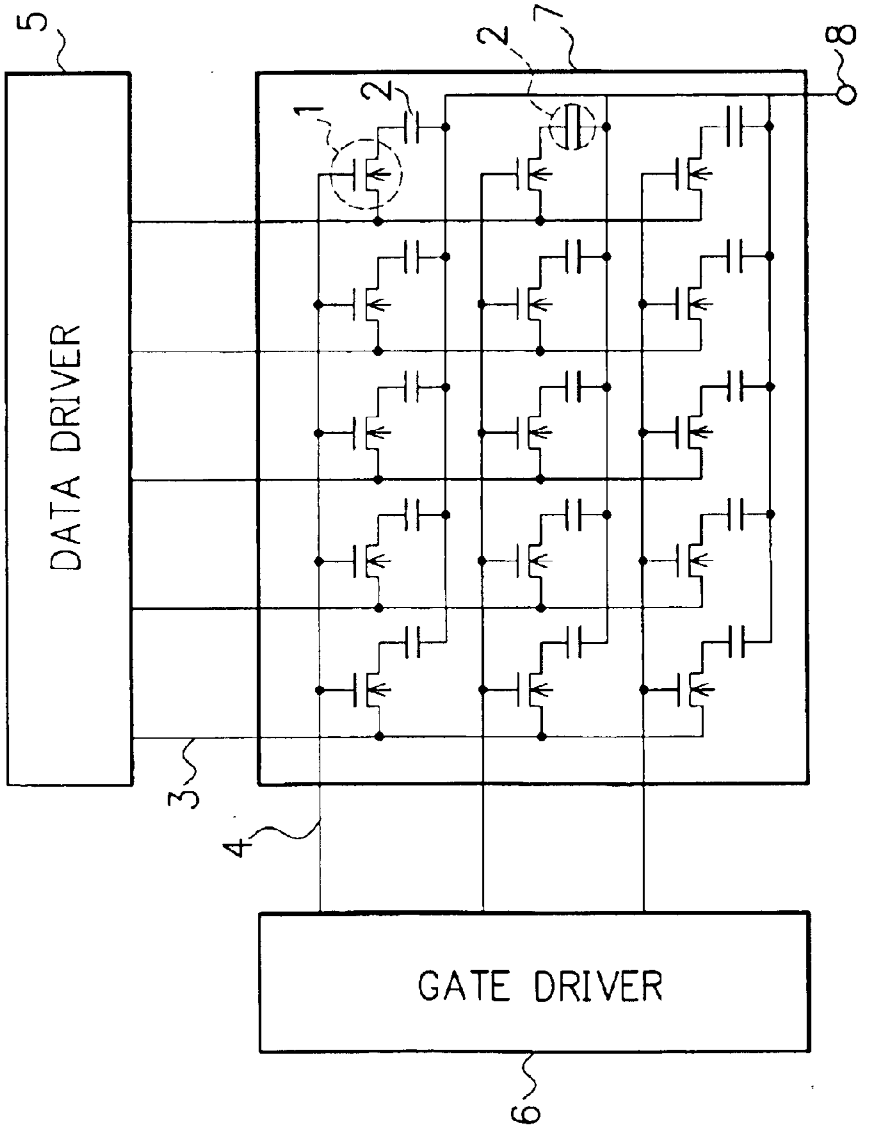
FIG. 26 PRIOR ART
FIG. 26 is a diagram showing a liquid crystal display substrate according to the prior art.

FIG. 25 shows a liquid crystal display device according to the nineteenth embodiment of the present invention. The point of the nineteenth embodiment differing from the eighteenth embodiment (FIG. 24) is explained. A light shielding region (black matrix) 21 is provided at a part of the substrate 54 except for the pixel region 7.

Because the inspection pixels 15 (inspection switching elements 9) become an obstacle during normal operation, black data is written in the inspection pixels 15 to bring them into a state without producing display during the normal operation. However, it is difficult to bring the inspection pixels 15 into a complete black display, which causes a not slight decrease in contrast. The provision of the light shielding region 21 at the part covering the inspection pixels 15 as in this embodiment enables a complete black display of the inspection pixels 15, thereby preventing a decrease in contrast.

A method of forming a light shielding film by processing is preferable as a light shielding method. This method has a high light shielding accuracy. Other than the above, there is a light shielding method with a mechanical structure (light shielding tape, bezel or the like).

According to the first to nineteenth embodiments, judgement can easily be made whether the liquid crystal display substrate, as it is, passes or fails an inspection, which enables the period required for the inspection to be made short as compared to the conventional inspection method, and the disposal of a member attendant on the panelizing test becomes unnecessary, which leads to cost reduction.

It should be noted that any of the above-described embodiments is just a concrete example for carrying out the present invention, and therefore the technical range of the present invention is not intended to be interpreted in a narrow sense by them. In other words, the present invention can be realized in various forms without departing from its technical idea or its primary characteristics.

As has been described, the provision of the first and second inspection circuits on the liquid crystal display substrate enables, before unitization of the liquid crystal display device, inspection of breaks in the data lines, short circuits between adjacent data lines, breaks in the scanning lines, short circuits between adjacent pixels, short circuits to other signal lines, and the like. The separation of the first inspection circuit after the inspection enables the data driver to be connected to the liquid crystal display substrate, thereby providing a liquid crystal display device at a lower cost.

What is claimed is:

1. A liquid crystal display device, comprising:

a display circuit including data lines and scanning lines arranged in a two-dimensional matrix, and switching elements connected between said data lines and said scanning lines;

a first inspection circuit including an inspection voltage input and/or output terminal for inputting and/or outputting an inspection voltage to/from one end of one of said data lines via a first analog switch; and a second inspection circuit including an inspection voltage input and/or output terminal for inputting and/or outputting an inspection voltage to/from another end of said data line, wherein said display circuit, said first inspection circuit, and said second inspection circuit are provided on one substrate, and said first inspection circuit is constructed to be separated from said display circuit.

2. The liquid crystal display device according to claim 1, wherein said first and second inspection circuits are constructed to be separated from said display circuit.

3. The liquid crystal display device according to claim 1, wherein said first inspection circuit has a second analog switch with a control terminal connected to a shift register, and one end of said second analog switch is connected to said data line via said first analog switch and other end is connected to said inspection voltage input and/or output terminal, and wherein said second inspection circuit has a third analog switch, and one end of said third analog switch is connected to the other end of said data line and another end is connected to said inspection voltage input and/or output terminal.

4. The liquid crystal display device according to claim 3, wherein an inspection transistor is provided at an end of each of said scanning lines, a scanning line driver is connected to a gate terminal of said inspection transistor, an inspection voltage input/output terminal is connected to a drain or source terminal, and a capacitor is connected to the source or drain terminal.

5. The liquid crystal display device according to claim 3, wherein said shift register of said first inspection circuit turns on said second analog switch to check from said inspection voltage output terminal of said first inspection circuit an inspection voltage inputted to said inspection voltage input terminal of said second inspection circuit to thereby inspect a break or a short circuit in said data line.

6. The liquid crystal display device according to claim 3, wherein said second inspection circuit has first and second inspection voltage input terminals, and said third analog switches are alternately connected to said first and second inspection voltage input terminals, and wherein said first inspection circuit has first and second inspection voltage output terminals, and said second analog switches are alternately connected to said first and second inspection voltage output terminals.

7. The liquid crystal display device according to claim 6, wherein said first and second inspection voltage output terminals of said first inspection circuit are capable of verifying whether a break or a short circuit is caused in said data lines by checking outputs of inspection voltages inputted to said first and second inspection voltage input terminals of said second inspection circuit.

8. The liquid crystal display device according to claim 7, wherein different inspection voltages are inputted to said first and second inspection voltage input terminals of said second inspection circuit.

9. The liquid crystal display device according to claim 3, wherein said first inspection circuit has first and second inspection voltage input/output terminals, and said second analog switches are connected alternately to said first and second inspection voltage input/output terminals.

10. The liquid crystal display device according to claim 9, wherein said first inspection circuit is capable of checking a short circuit between lines connecting said first and second analog switches by verifying whether an inspection voltage inputted to said first inspection voltage input/output terminal is outputted from said second inspection voltage input/output terminal while said first analog switches are turned off.

11. The liquid crystal display device according to claim 4, wherein said inspection transistor is provided to input an inspection voltage to the drain or source terminal via said inspection voltage input/output terminal, to charge said capacitor connected to the source or drain terminal with said inspection voltage when said inspection transistor is turned on by said scanning line driver, and to check said inspection voltage stored in said capacitor from said inspection voltage input/output terminal when said inspection transistor is turned on again by said scanning line diver.

12. A method of inspecting the liquid crystal display device claimed in claim 3, comprising the steps of:

(a) turning on said first to third analog switches; and (b) inspecting a break or a short circuit in said data line by checking from said inspection voltage output terminal of said first inspection circuit the inspection voltage inputted to said inspection voltage input terminal of said second inspection circuit.

13. A method of inspecting the liquid crystal display device claimed in claim 6, comprising the steps of:

(a) turning on said first to third analog switches to connect said first and second inspection voltage input terminals of said second inspection circuit to said first and second inspection voltage output terminals of said first inspection circuit respectively; and (b) verifying whether a break or a short circuit is caused in said data lines by verifying whether the inspection voltages inputted to said first and second inspection voltage input terminals of said second inspection circuit are outputted from said first and second inspection voltage output terminals of said first inspection circuit.

14. A method of inspecting the liquid crystal display device claimed in claim 9, comprising the steps of:

(a) turning on said second analog switches corresponding to said first and second inspection voltage input/output terminals of said first inspection circuit and turning off said first analog switches; and (b) checking a short circuit between lines connecting said first and second analog switches by verifying whether the inspection voltage inputted to said first inspection voltage input/output terminal of said first inspection circuit is detected from said second inspection voltage input/output terminal of said first inspection circuit.

15. A method of inspecting the liquid crystal display device claimed in claim 4, comprising the steps of:

(a) turning on said inspection transistor by said scanning line driver;

(b) inputting an inspection voltage to the drain or source terminal of said inspection transistor via said inspection voltage input/output terminal to charge with said inspection voltage said capacitor connected to the source or drain terminal of said inspection transistor;

(c) turning on said inspection transistor again by said scanning line driver; and (d) verifying whether the inspection voltage stored in said capacitor is outputted from paid inspection voltage input/output terminal.

16. A liquid crystal display device, comprising:

first switching elements connected to liquid crystal capacitors via pixel electrodes respectively;

data lines for supplying data to said first switching elements;

scanning lines for controlling said first switching elements;

second switching elements each having a control terminal connected to said data line or said scanning line, and an input/output terminal with one end connected to a common inspection input/output terminal and another end connected to a capacitor; and a bidirectional switch connected to the common inspection input/output terminal.

17. The liquid crystal display device according to claim 16, further comprising:

a data supply circuit including a data line driver or a switching element for supplying data to said data line; and a scanning signal supply circuit for supplying scanning signals to said scanning line.

18. The liquid crystal display device according to claim 16, wherein said capacitor increases a storable capacity thereof by connecting one end thereof to said second switching element an another end in common.

19. The liquid crystal display device according to claim 16, wherein said other end of said second switching element is connected to said liquid crystal capacitor via said pixel electrode.

20. The liquid crystal display device according to claim 16, wherein said second switching elements include switching elements with control terminals connected to said data lines and switching elements with control terminals connected to said scanning lines.

21. The liquid crystal display device according to claim 16, wherein said one end of said second switching element is connected to a common inspection input/output terminal and said data line.

22. The liquid crystal display device according to claim 16, further comprising:

a third switching element for resetting for presetting said capacitor connected to said second switching element.

23. The liquid crystal display device according to claim 16, wherein said second switching elements are provided inside a sealing part for sealing liquid crystal in said liquid crystal display device.

24. The liquid crystal display device according to claim 16, wherein said second switching elements are provided outside a sealing part for sealing liquid crystal in said liquid crystal display device.

25. The liquid crystal display device according to claim 20, wherein said switching elements connected to said data lines and said switching elements connected to said scanning lines are connected to a common inspection input/output terminal.

26. The liquid crystal display device according to claim 20, wherein said switching elements connected to said data lines and said switching elements connected to said scanning lines are connected to different inspection input/output terminals.

27. The liquid crystal display device according to claim 19, further comprising:

a light shield for shielding from light pixels corresponding to said second switching elements.

28. A liquid crystal display device, comprising:

a display circuit including data lines and scanning lines arranged in a two-dimensional matrix, and switching elements connected between said data lines and said scanning lines;

a first inspection circuit including an inspection voltage input and/or output terminal for inputting and/or outputting an inspection voltage to/from one end of one of said data lines via a first analog switch, and a second analog switch with a control terminal connected to a shift register, one end of said second analog switch being connected to said data line via said first analog switch and another end being connected to said inspection voltage input and/or output terminal; and a second inspection circuit including an inspection voltage input and/or output terminal for inputting and/or outputting an inspection voltage to/from another end of said data line, a third analog switch, one end of said third analog switch being connected to the other end of said data line and another end being connected to said inspection voltage input and/or output terminal; and wherein said display circuit, said first inspection circuit, and said second inspection circuit are provided on one substrate, and said first inspection circuit is separable from said display circuit.

29. The liquid crystal display device according to claim 28, wherein an inspection transistor is provided at an end of each of said scanning lines, a scanning line driver is connected to a gate terminal of said inspection transistor, an inspection voltage input/output terminal is connected to a drain or source terminal, and a capacitor is connected to the source or drain terminal.

30. The liquid crystal display device according to claim 28, wherein said shift register of said first inspection circuit turns on said second analog switch check from said inspection voltage output terminal of said first inspection circuit an inspection voltage inputted to said inspection voltage input terminal of said second inspection circuit to thereby inspect a break or a short circuit in said data line.

31. The liquid crystal display device according to claim 28, wherein said second inspection circuit has first and second inspection voltage input terminals, and said third analog switches are alternately connected to said first and second inspection voltage input terminals, and wherein said first inspection circuit has first and second inspection voltage output terminals, and said second analog switches are alternately connected to said first and second inspection voltage output terminals.

32. The liquid crystal display device according to claim 31, wherein said first and second inspection voltage output terminals of said first inspection circuit are capable of verifying whether a break or a short circuit is caused in said data lines by checking outputs of inspection voltages inputted to said first and second inspection voltage input terminals of said second inspection circuit.

33. The liquid crystal display device according to claim 32, wherein different inspection voltages are inputted to said first and second inspection voltage input terminals of said second inspection circuit.

34. The liquid crystal display device according to claim 28, wherein said first inspection circuit has first and second inspection voltage input/output terminals, and said second analog switches are connected alternately to said first and second inspection voltage input/output terminals.

35. The liquid crystal display device according to claim 34, wherein said first inspection circuit is capable of checking a short circuit between lines connecting said first and second analog switches by verifying whether an inspection voltage inputted to said first inspection voltage input/output terminal is outputted from said second inspection voltage input/output terminal while said first analog switches are turned off.

36. The liquid crystal display device according to claim 29, wherein said inspection transistor is provided to input an inspection voltage to the drain or source terminal via said inspection voltage input/output terminal, to charge said capacitor connected to the source or drain terminal with said inspection voltage when said inspection transistor is turned on by said scanning line driver, and to check said inspection voltage stored in said capacitor from said inspection voltage input/output terminal when said inspection transistor is turned on again by said scanning line driver.

37. A method of inspecting the liquid crystal display device claimed in claim 28, comprising the steps of:

(a) turning on said first to third analog switches; and (b) inspecting a break or a short circuit in said data line by checking from said inspection voltage output terminal of said first inspection circuit the inspection voltage inputted to said inspection voltage input terminal of said second inspection circuit.

38. A method of inspecting the liquid crystal display device claimed in claim 31, comprising the steps of:

(a) turning on said first to third analog switches to connect said first and second inspection voltage input terminals of said second inspection circuit to said first and second inspection voltage output terminals of said first inspection circuit respectively; and (b) verifying whether a break or a short circuit is caused in said data lines by verifying whether the inspection voltages inputted to said first and second inspection voltage input terminals of said second inspection circuit are outputted from said first and second inspection voltage output terminals of said first inspection circuit.

39. A method of inspecting the liquid crystal display device claimed in claim 34, comprising the steps of:

(a) turning on said second analog switches corresponding to said first and second inspection voltage input/output terminals of said first inspection circuit and turning off said first analog switches; and (b) checking a short circuit between lines connecting said first and second analog switches by verifying whether the inspection voltage inputted to said first inspection voltage input/output terminal of said first inspection circuit is detected from said second inspection voltage input/output terminal of said first inspection circuit.

40. A method of inspecting the liquid crystal display device claimed in claim 29, comprising the steps of:

(a) turning on said inspection transistor by said scanning line driver;

(b) inputting an inspection voltage to the drain or source terminal of said inspection transistor via said inspection voltage input/output terminal to charge with said inspection voltage said capacitor connected to the source or drain terminal of said inspection transistor;

(c) turning on said inspection transistor again by said scanning line driver; and (d) verifying whether the inspection voltage stored in said capacitor is outputted from said inspection voltage input/output terminal.

* * * * *

UNITED STATES PATENT AND TRADEMARK OFFICE

CERTIFICATE OF CORRECTION

PATENT NO. : 6,853,364 B2
DATED : February 8, 2005
INVENTOR(S) : Tsutomu Kai

It is certified that error appears in the above-identified patent and that said Letters Patent is hereby corrected as shown below:

Title page,
Item [57], ABSTRACT,
Lines 2 and 3, delete “in two-dimensional” and insert -- in a two-dimensional --.

Column 15,
Line 15, delete “and other” and insert -- another --.

Column 16,
Line 16, delete “diver” and insert -- driver --.
Line 63, delete “paid” and insert -- said --.

Column 17,
Line 44, delete “resetting for” and insert -- resetting or --.

Column 18,
Line 42, delete “switch check” and insert -- switch to check --.

Signed and Sealed this

Eleventh Day of October, 2005

JON W. DUDAS
*Director of the United States Patent and Trademark Office*